United States Patent
Liao et al.

(10) Patent No.: US 10,276,574 B2
(45) Date of Patent: Apr. 30, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chia-Chun Liao, Hsinchu (TW); Chun-Sheng Liang, Changhua County (TW); Shu-Hui Wang, Hsinchu (TW); Shih-Hsun Chang, Hsinchu (TW); Yi-Jen Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/211,871

(22) Filed: Jul. 15, 2016

(65) Prior Publication Data
US 2018/0019242 A1    Jan. 18, 2018

(51) Int. Cl.
*H01L 27/092* (2006.01)
*H01L 29/51* (2006.01)
*H01L 29/66* (2006.01)
*H01L 29/49* (2006.01)
*H01L 21/8238* (2006.01)

(52) U.S. Cl.
CPC .. *H01L 27/0924* (2013.01); *H01L 21/823821* (2013.01); *H01L 21/823842* (2013.01); *H01L 27/0922* (2013.01); *H01L 29/517* (2013.01); *H01L 29/66545* (2013.01); *H01L 29/4958* (2013.01); *H01L 29/4966* (2013.01); *H01L 29/4975* (2013.01)

(58) Field of Classification Search
CPC ............. H01L 27/0924; H01L 27/0922; H01L 21/32115; H01L 21/823821; H01L 21/823842; H01L 29/517; H01L 29/66545
See application file for complete search history.

(56) References Cited

U.S. PATENT DOCUMENTS

| | | | |
|---|---|---|---|
| 8,487,378 B2 | 7/2013 | Goto et al. |
| 8,580,641 B2 | 11/2013 | Lu et al. |
| 8,729,634 B2 | 5/2014 | Shen et al. |
| 8,826,213 B1 | 9/2014 | Ho et al. |
| 8,887,106 B2 | 11/2014 | Ho et al. |
| 2014/0282326 A1 | 9/2014 | Chen et al. |

(Continued)

*Primary Examiner* — Christine A Enad
(74) *Attorney, Agent, or Firm* — McDermott Will & Emery LLP

(57) ABSTRACT

A semiconductor device manufacturing method includes forming fins in first and second regions defined on a substrate. The fins include first fin, second fin, third fin, and fourth fin. A dielectric layer is formed over fins and a work function adjustment layer is formed over dielectric layer. A hard mask is formed covering third and fourth fins. A first conductive material layer is formed over first fin and not over second fin. A second conductive material layer is formed over first and second fins. A first metal gate electrode fill material is formed over first and second fins. The hard mask covering third and fourth fins is removed. A third conductive material layer is formed over third fin and not over fourth fin. A fourth conductive material layer is formed over third and fourth fins, and a second metal gate electrode fill material is formed over third and fourth fins.

29 Claims, 21 Drawing Sheets

(56) References Cited

U.S. PATENT DOCUMENTS

| | | | |
|---|---|---|---|
| 2017/0053996 A1* | 2/2017 | Kim | H01L 21/28088 |
| 2017/0148792 A1* | 5/2017 | Kim | H01L 27/092 |
| 2017/0154972 A1* | 6/2017 | Hsieh | H01L 21/0276 |
| 2017/0162575 A1* | 6/2017 | Li | H01L 27/0924 |
| 2017/0236821 A1* | 8/2017 | Kim | H01L 27/0886 257/401 |
| 2018/0019314 A1* | 1/2018 | Kim | H01L 21/82345 |

* cited by examiner

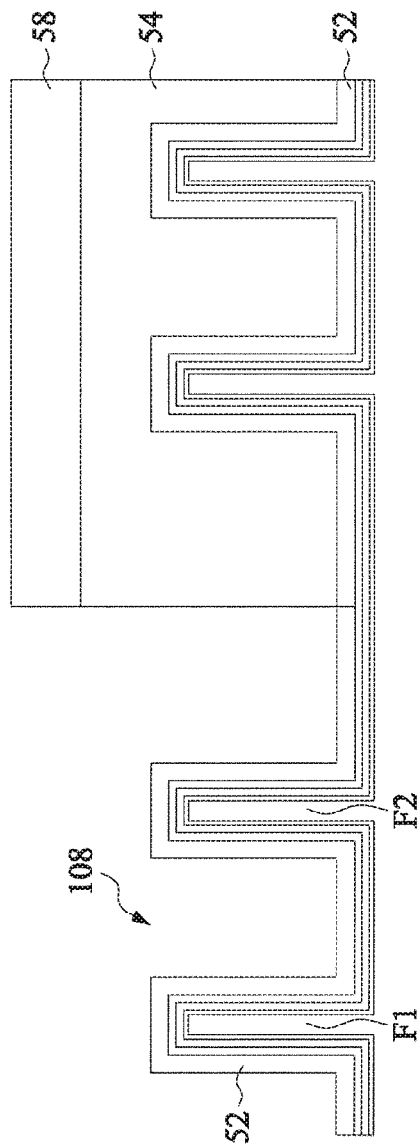
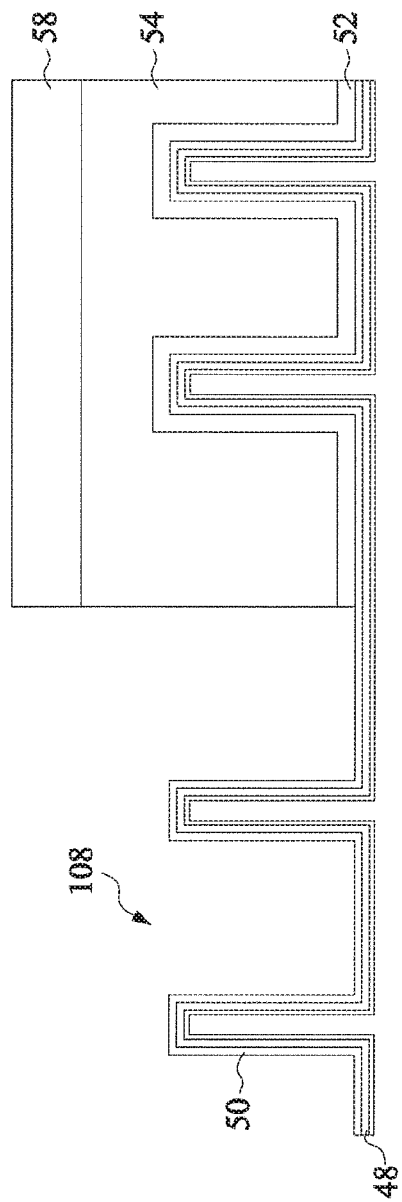
Fig. 10
Fig. 11

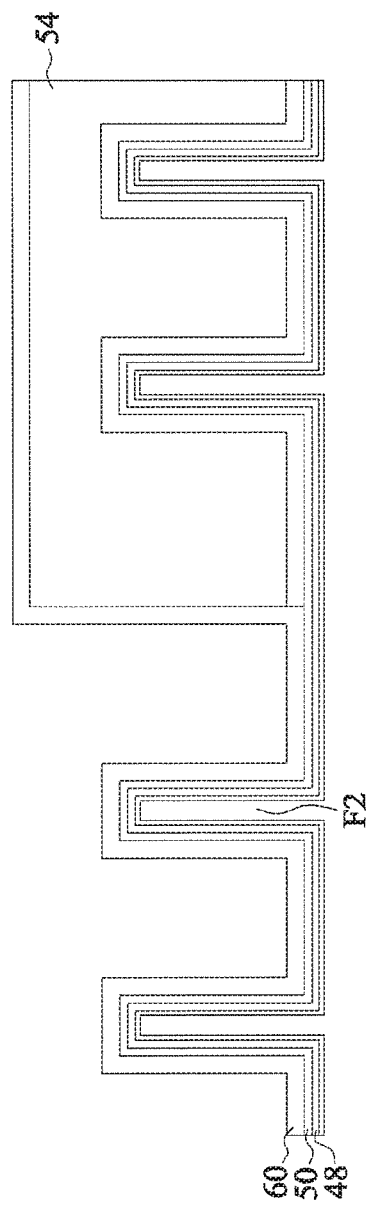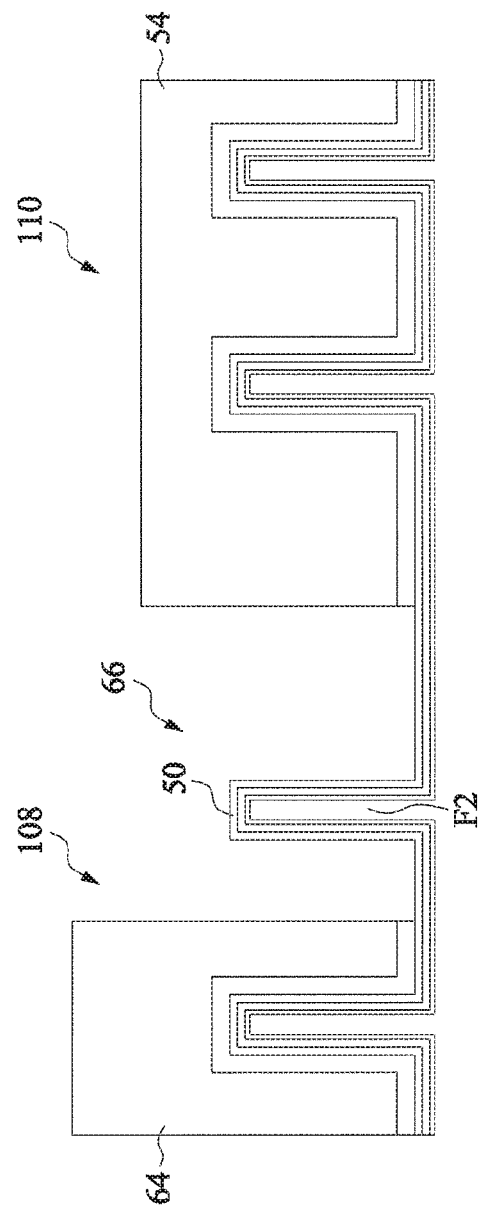

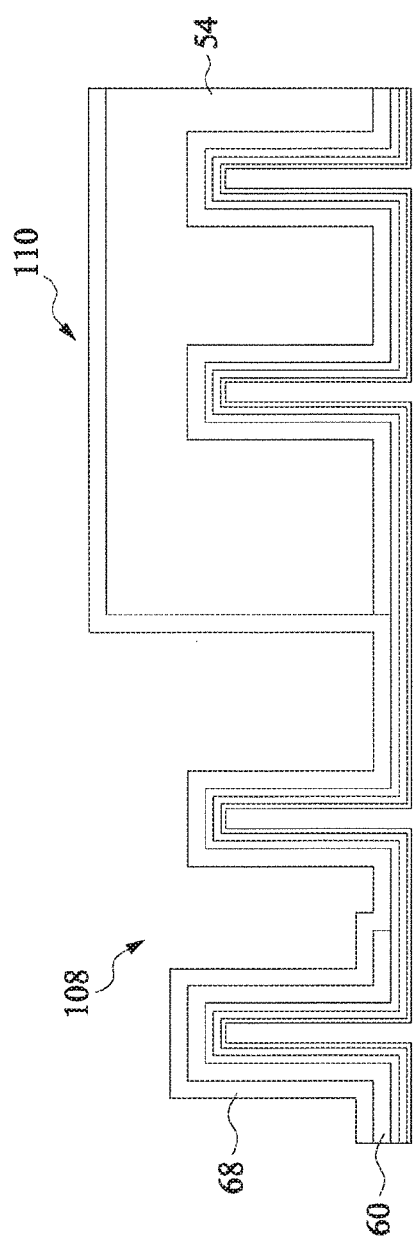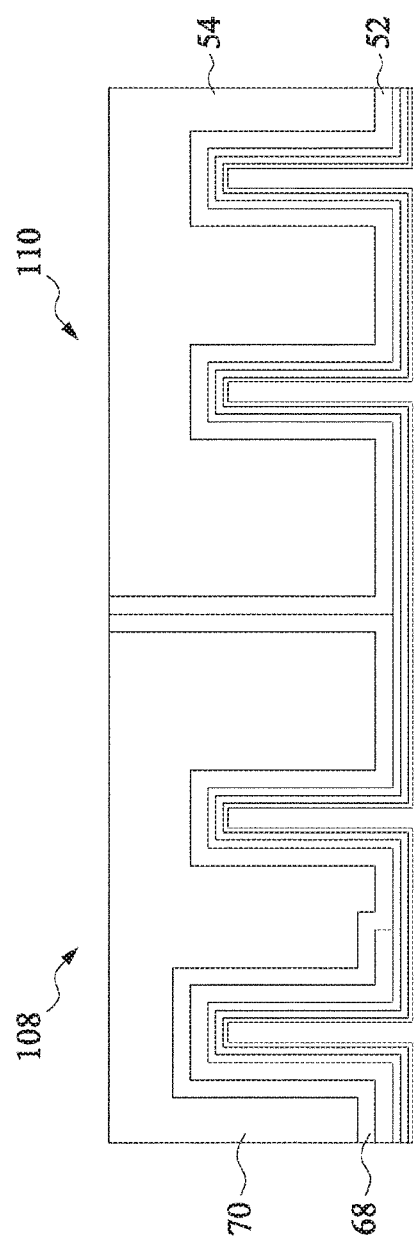

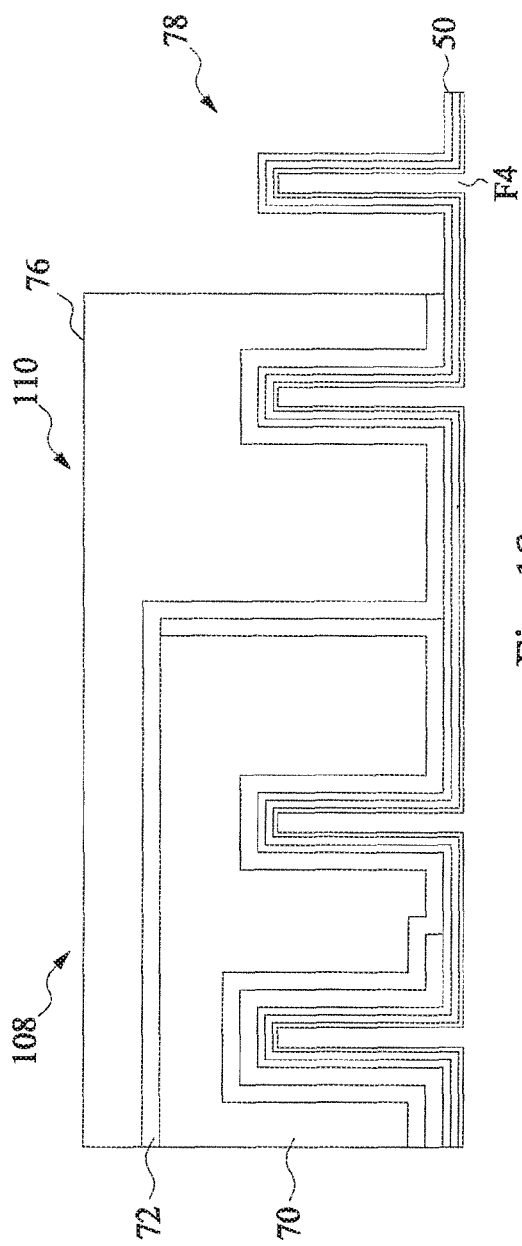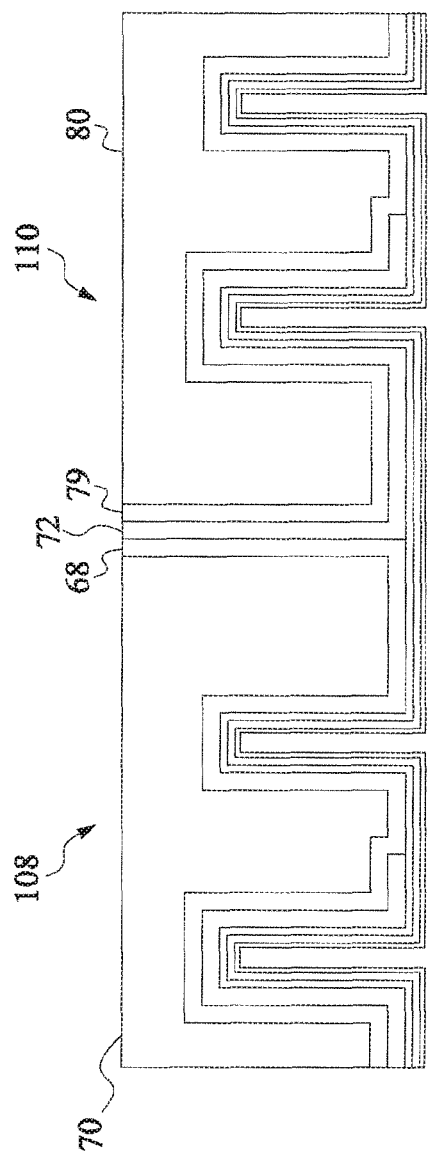
Fig. 18
Fig. 19

SEMICONDUCTOR DEVICE AND MANUFACTURING METHOD THEREOF

TECHNICAL FIELD

The disclosure relates to a semiconductor integrated circuit, and more particularly to a semiconductor device having a high-k metal gate structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET) and the use of a metal gate structure with a high-k (dielectric constant) material. The metal gate structure is often manufactured by using gate replacement technologies, and sources and drains are formed by using an epitaxial growth method. As semiconductor devices progress into nanometer technology space for metal gates becomes smaller, resulting in difficulty in threshold voltage tuning of the device, and difficulty in etching due to high aspect ratio of device features, such as fins and gate electrodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8-19 show a process for forming a multigate semiconductor device according to an embodiment of the present disclosure.

Figure 1:
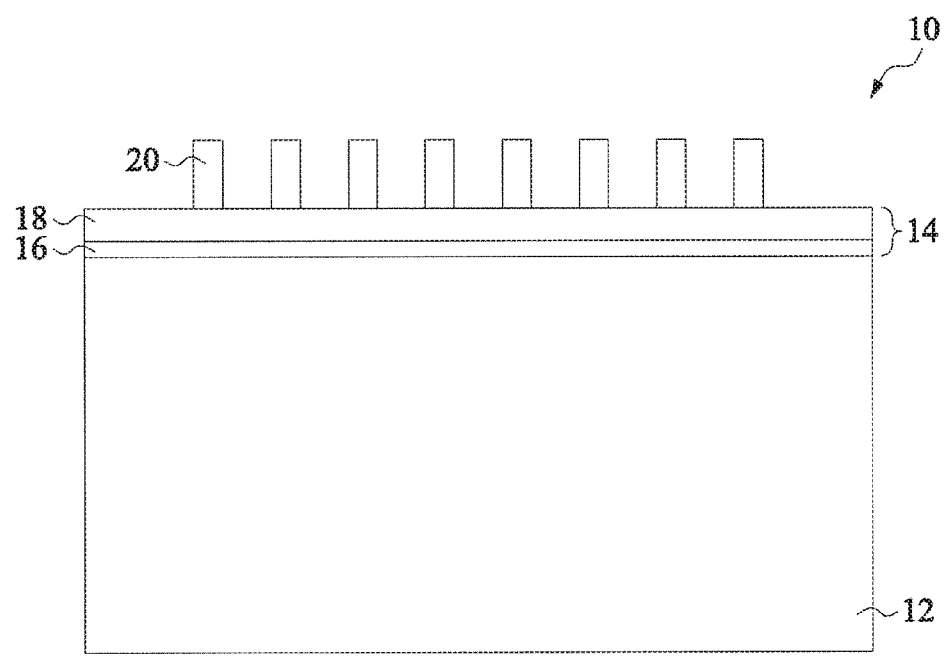
FIGS. 1-7 show an exemplary process for manufacturing a FinFET semiconductor device.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Examples of devices that can benefit from one or more embodiments of the present disclosure are semiconductor devices. Such a device, for example, is a FinFET device. FinFETs are field effect transistors formed on fin structures formed over a substrate. In some embodiments, the fins are formed in an array. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will include a FinFET example to illustrate various embodiments of the present application. It is understood, however, that the application should not be limited to a particular type of device, except as specifically claimed.

To fabricate a semiconductor device 10 according to an embodiment of the present disclosure including one or more fins, a mask layer 14 is formed over a substrate 12, as illustrated in FIG. 1. The mask layer 14 is formed by, for example, a thermal oxidation process and/or a chemical vapor deposition (CVD) process. The substrate 12 is, for example, a P-type silicon substrate with an impurity concentration in a range of about $1 \times 10^{15}$ cm$^{-3}$ to about $2 \times 10^{15}$ atoms cm$^{-3}$. In other embodiments, the substrate 12 is an N-type silicon substrate with an impurity concentration in a range of about $1 \times 10^{15}$ cm$^{-3}$ to about $2 \times 10^{15}$ atoms cm$^{-3}$. The mask layer 14 includes, for example, a pad oxide (e.g., silicon oxide) layer 16 and a silicon nitride mask layer 18 in some embodiments.

Alternatively, the substrate 12 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 12 is a silicon layer of an SOI (silicon-on insulator) substrate. Amorphous substrates, such as amorphous Si or amorphous SiC, or insulating material, such as silicon oxide may also be used as the substrate 12. The substrate 12 may include various regions that have been suitably doped with impurities (e.g., P-type or N-type conductivity).

The pad oxide layer 16 may be formed by using thermal oxidation or a CVD process. The silicon nitride mask layer 18 may be formed by a CVD, plasma-enhanced chemical vapor deposition (PECVD), an atmospheric pressure chemical vapor deposition (APCVD), a low-pressure CVD (LP-CVD), a high density plasma CVD (HDPCVD), an atomic layer deposition (ALD), a physical vapor deposition (PVD), such as a sputtering method, and/or other processes.

The thickness of the pad oxide layer 16 is in a range of about 2 nm to about 15 nm and the thickness of the silicon nitride mask layer 18 is in a range of about 2 nm to about 50 nm in some embodiments. A mask pattern 20 is further formed over the mask layer 14. The mask pattern 20 is, for example, a resist pattern formed by lithography operations.

By using the mask pattern 20 as an etching mask, a hard mask pattern of the pad oxide layer 16 and the silicon nitride mask layer 18 is formed. The width of the hard mask pattern is in a range of about 5 nm to about 40 nm in some embodiments. In certain embodiments, the width of the hard mask patterns is in a range of about 7 nm to about 12 nm.

Figure 2:
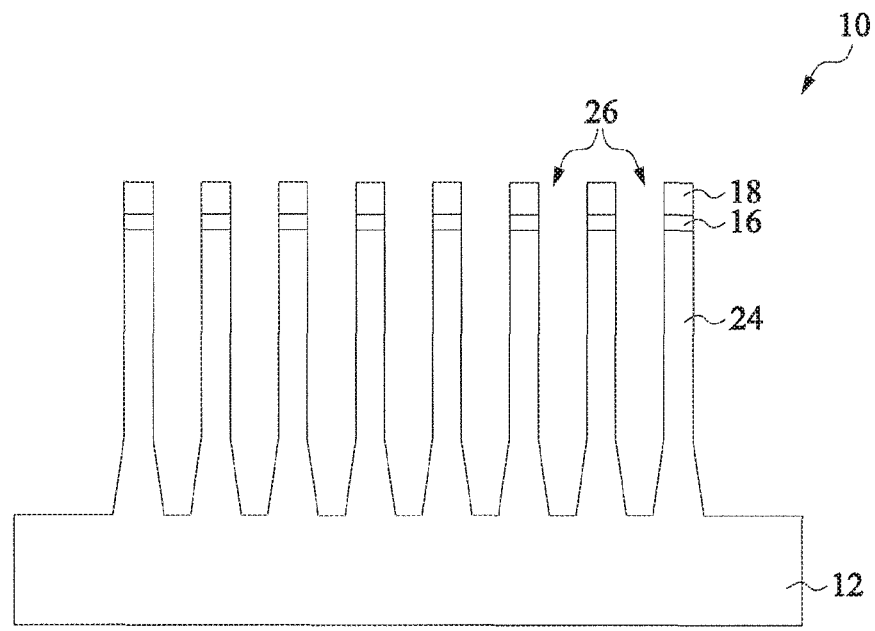

By using the hard mask pattern as an etching mask, the substrate 12 is patterned into a plurality of fins 24, as shown in FIG. 2, by trench etching using a dry etching method and/or a wet etching method to form trenches 26. A height of the fins 24 is in a range of about 20 nm to about 300 nm. In certain embodiments, the height is in a range of about 30 nm to about 60 nm. When the heights of the fins 24 are not uniform, the height from the substrate may be measured from the plane that corresponds to the average heights of the fins 24.

In this embodiment, a bulk silicon wafer is used as the substrate 12. However, in some embodiments, other types of substrates may be used as the substrate 12. For example, a silicon-on-insulator (SOI) wafer may be used as a starting material, and the insulator layer of the SOI wafer constitutes the substrate 12 and the silicon layer of the SOI wafer is used for the fins 24.

As shown in FIG. 2, eight fins 24 are disposed over the substrate 12. However, the number of fins is not limited to eight. There may be as few as one fin and more than eight fins. In addition, one or more dummy fins may be disposed adjacent to the sides of the fins to improve pattern fidelity in the patterning processes. The width of each fin 24 is in a range of about 5 nm to about 40 nm in some embodiments, and in a range of about 7 nm to about 15 nm in other embodiments. The width of trenches 26 between adjacent fins is in a range of about 5 nm to about 80 nm in some embodiments, and in a range of about 7 nm to about 15 nm in other embodiments. One skilled in the art will realize, however, that the dimensions and values recited throughout the descriptions are merely exemplary, and may be changed to suit different scales of integrated circuits.

Figure 3:
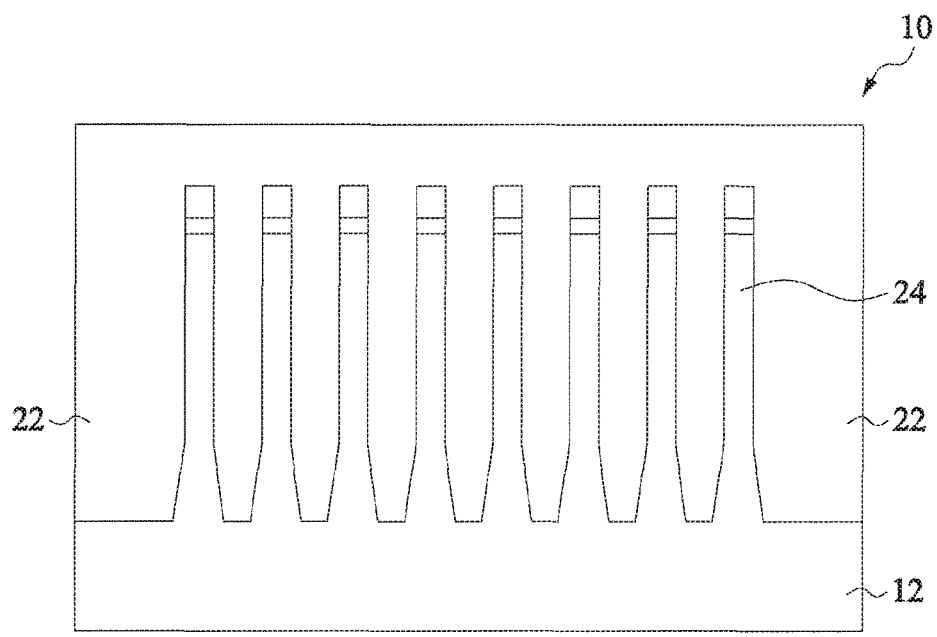

After forming the fins 24, an isolation insulating layer 22 is formed in trenches 26 between the fins 24 and overlying the fins 24, so that the fins 24 are buried in isolation insulating layer 22, as illustrated in FIG. 3. The isolation insulating layer 22 is also referred to as shallow trench insulation (STI).

The isolation insulating layer 22 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 22 is formed by one or more layers of SOG, SiO, SiON, SiOCN and/or fluorine-doped silicate glass (FSG) in some embodiments.

Figure 4:
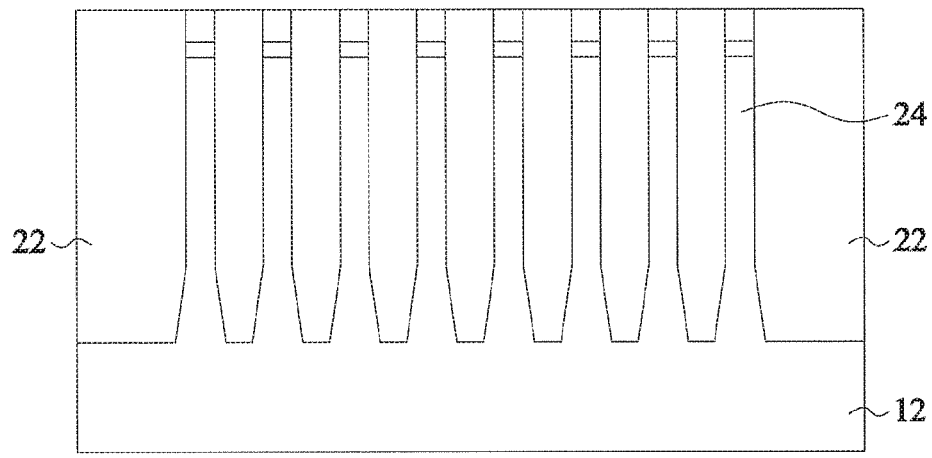

A planarization operation is performed so as to remove part of the isolation insulating layer 22, as illustrated in FIG. 4. The planarization operation may include a chemical mechanical polishing (CMP) and/or an etch-back process.

Figure 5:
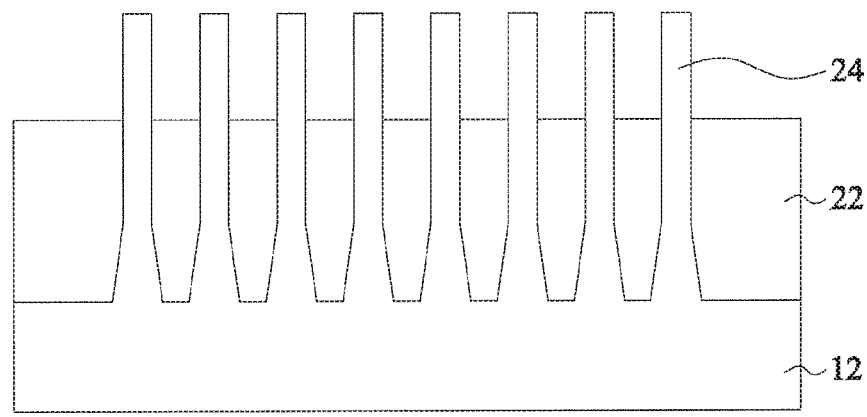

The mask layer 14 may be removed, and an upper portion of the isolation insulating layer 22 is further removed so that the channel region (upper portion) of the fins 24 is exposed, as shown in FIG. 5.

In certain embodiments, removal of the mask layer 14 and partially removing the isolation insulating layer 22 are performed using a suitable etching process. For example, the mask layer 14 may be removed by a wet etching process, such as, by dipping the substrate in hydrofluoric acid (HF) or phosphoric acid ($H_3PO_4$). On the other hand, the partially removing the isolation insulating layer 22 may be performed using a dry etching process. For example, a dry etching process using $CHF_3$ as etching gases may be used.

Figure 6:
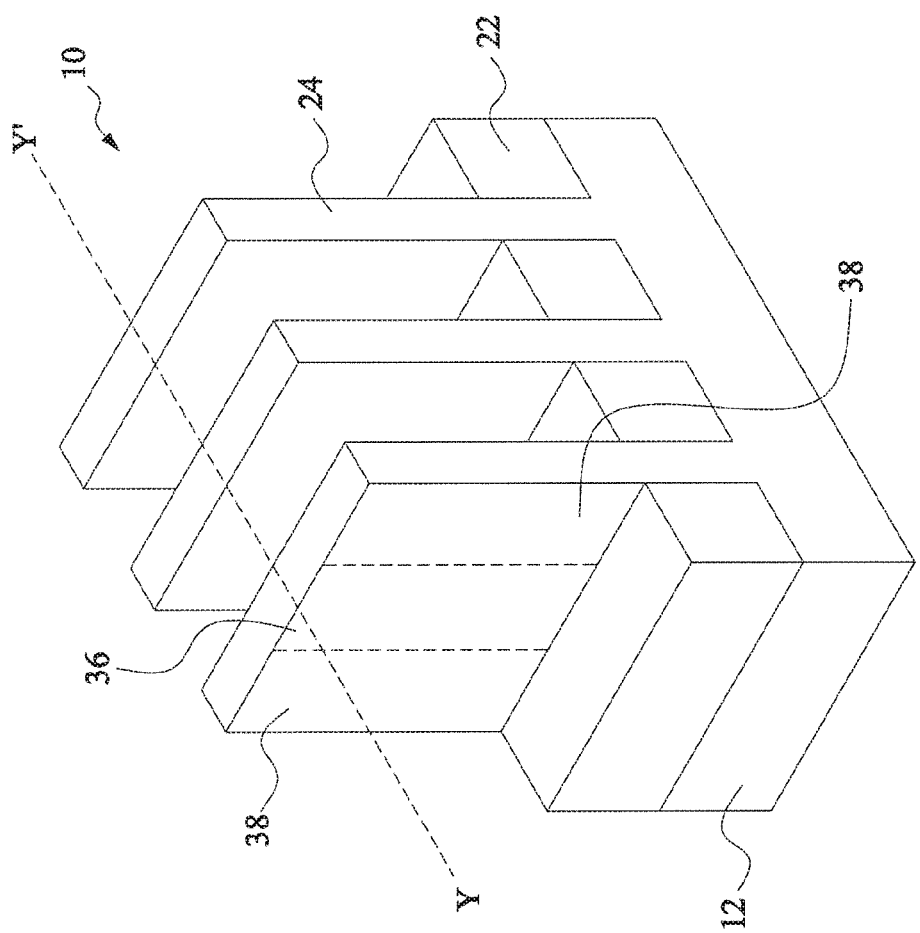

An isometric view of the device 10 showing the fins 24 exposed from the isolation insulating layer 22 is depicted in FIG. 6. To simplify the disclosure, only three fins are shown in FIG. 6. The exposed portions of the fins 24 comprise two regions. A first region 36 in a central portion of the fin 24 is where a gate structure will be formed, and a second region 38 at the peripheral portions of the fin 24 is where source/drain regions will be formed. In the present disclosure, a source and a drain are interchangeably used, and the term source/drain refers to either one of a source and a drain.

Figure 7:
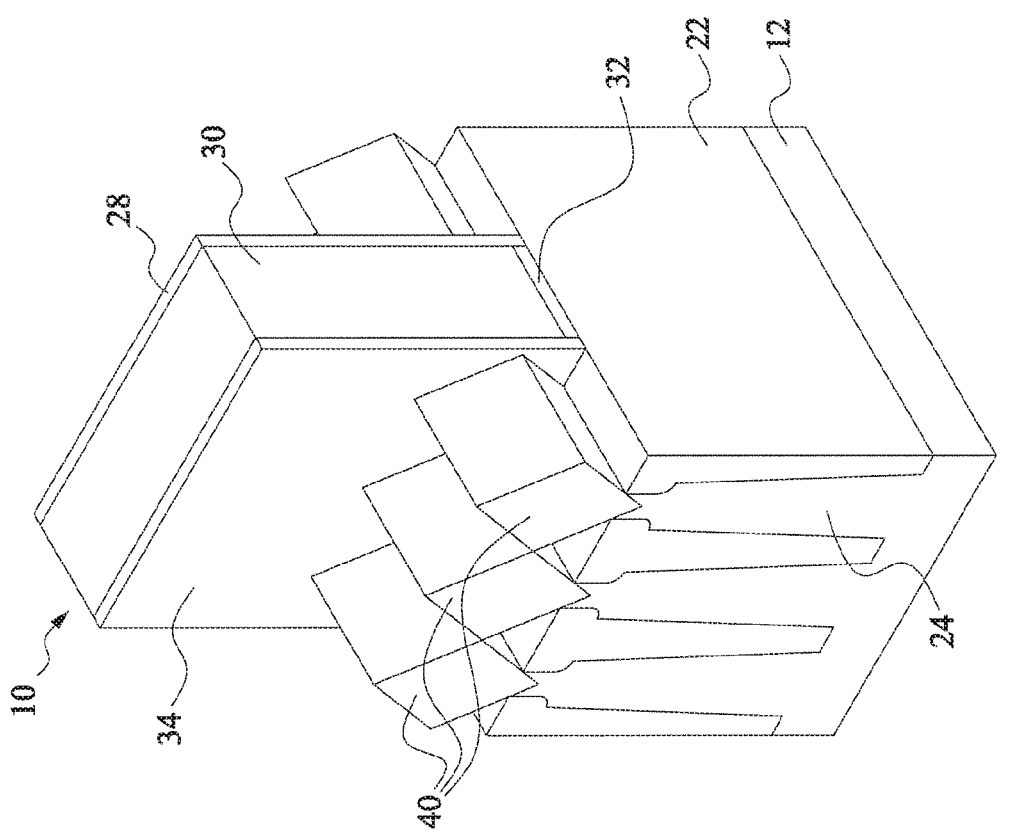

A gate structure 28 is subsequently formed over the first region 36 of the fins, as shown in FIG. 7. The gate structure formation process may include the operations of depositing a gate dielectric 32, depositing a gate electrode 30, patterning the gate electrode, lightly doped drain (LDD) implantation, and annealing. Sidewall spacers 34 are formed on the gate structure 28, and source/drain formation, implantation, and annealing are subsequently performed to provide source/drain regions 40.

The gate dielectric 32 may comprise one or more layers of silicon oxide, silicon nitride, silicon oxynitride, high-k dielectric material, other suitable dielectric material, and/or combinations thereof. The gate electrode 30 in certain embodiments is formed of polysilicon and may include a hard mask formed over the gate electrode. The hard mask may be made a suitable hard mask material, including $SiO_2$, SiN, or SiCN. In some embodiments, a thickness of the gate dielectric layer is in a range of about 5 nm to about 20 nm, and in a range of about 5 nm to about 10 nm in other embodiments. The gate electrode structure may comprise additional layers such as interfacial layers, capping layers, diffusion/barrier layers, dielectric layers, conductive layers, and other suitable layers, and combinations thereof. In some embodiments, a thickness of the gate electrode layer is in a range of about 50 nm to about 400 nm, and is in a range of about 100 nm to 200 nm in other embodiments.

In certain embodiments, the FinFET can be fabricated using a gate first method or a gate last method. In embodiments using a high-k dielectric and a metal gate, a gate last method is employed to form the gate electrode. In the gate last method, a dummy gate is formed, the dummy gate is subsequently removed at a later operation after a high temperature annealing operation, and the high-k dielectric and a metal gate is formed.

In some embodiments, the sidewall spacers 34 are used to offset subsequently formed doped regions, such as source/drain regions. The sidewall spacers 34 may further be used for designing or modifying the source/drain region (junction) profile. The sidewall spacers 34 may be formed by suitable deposition and etch techniques, and may comprise one or more layers of silicon nitride, silicon oxide, silicon carbide, silicon oxynitride, silicon carbon oxynitride, other suitable materials, or combinations thereof.

A blanket layer of a sidewall insulating material may be formed by CVD, PVD, ALD, or other suitable technique. Then, an anisotropic etching is performed on the side-wall insulating material to form a pair of sidewall insulating layers (spacers) 34 on two main sides of the gate structure 28. The thickness of the sidewall insulating layers 34 is in a range of about 5 nm to about 30 nm in some embodiments, and in a range of about 10 nm to about 20 nm in other embodiments. As shown in FIG. 7, in an embodiment, the side wall insulating layer is not formed over the regions of the fin including the source/drain regions 40.

The second region 38 of the fins not covered with the gate structure 28 in FIG. 6 are subsequently etched to remove the portion of the fins above the STI region 22. Suitable photolithographic and etching techniques can be used to remove the second region 38 of the fins.

In certain embodiments, raised source/drain regions 40 are subsequently formed overlying the etched portion of the fins 24, as shown in FIG. 7, providing a FinFET semiconductor device 10. The raised source/drain regions may be formed by one or more epitaxy or epitaxial (epi) processes, such that one or more of Si features, SiC features, SiGe features, SiP features, SiCP features, or Group III-V semiconductor material on Si EPI or other suitable features are formed in a crystalline state on the fins. The epitaxy processes include CVD deposition techniques (e.g., vapor-phase epitaxy (VPE) and/or ultra-high vacuum CVD (UHV-CVD)), molecular beam epitaxy, and/or other suitable processes.

In certain embodiments, the epitaxial growth of the source/drain regions is continued until the individual source/drain regions merge together to form a FinFET semiconductor device with merged source/drain regions. In order to use a high-k dielectric layer and a metal gate, a gate replacement technology is employed. In the gate replacement technology, the gate dielectric layer 32 and the gate electrode 30 are a "dummy" gate dielectric layer and a "dummy" gate electrode, which are removed and replaced with a high-k dielectric layer and a metal gate electrode.

After the source/drain regions are formed, an interlayer dielectric layer (ILD) is formed over the dummy gate structure and the source/drain regions. After a planarization operation on the ILD layer, the dummy gate structure is removed so as to form a gate space between the sidewall insulating layers 34.

FIGS. 8-19 show a process for forming a multigate semiconductor device according to an embodiment of the present disclosure. FIGS. 8-19 are cross section views taken along the Y-Y' direction of the semiconductor device 10 (see FIG. 6). This cross section view shows the region 36 where the gate electrode is formed.

Figure 8:
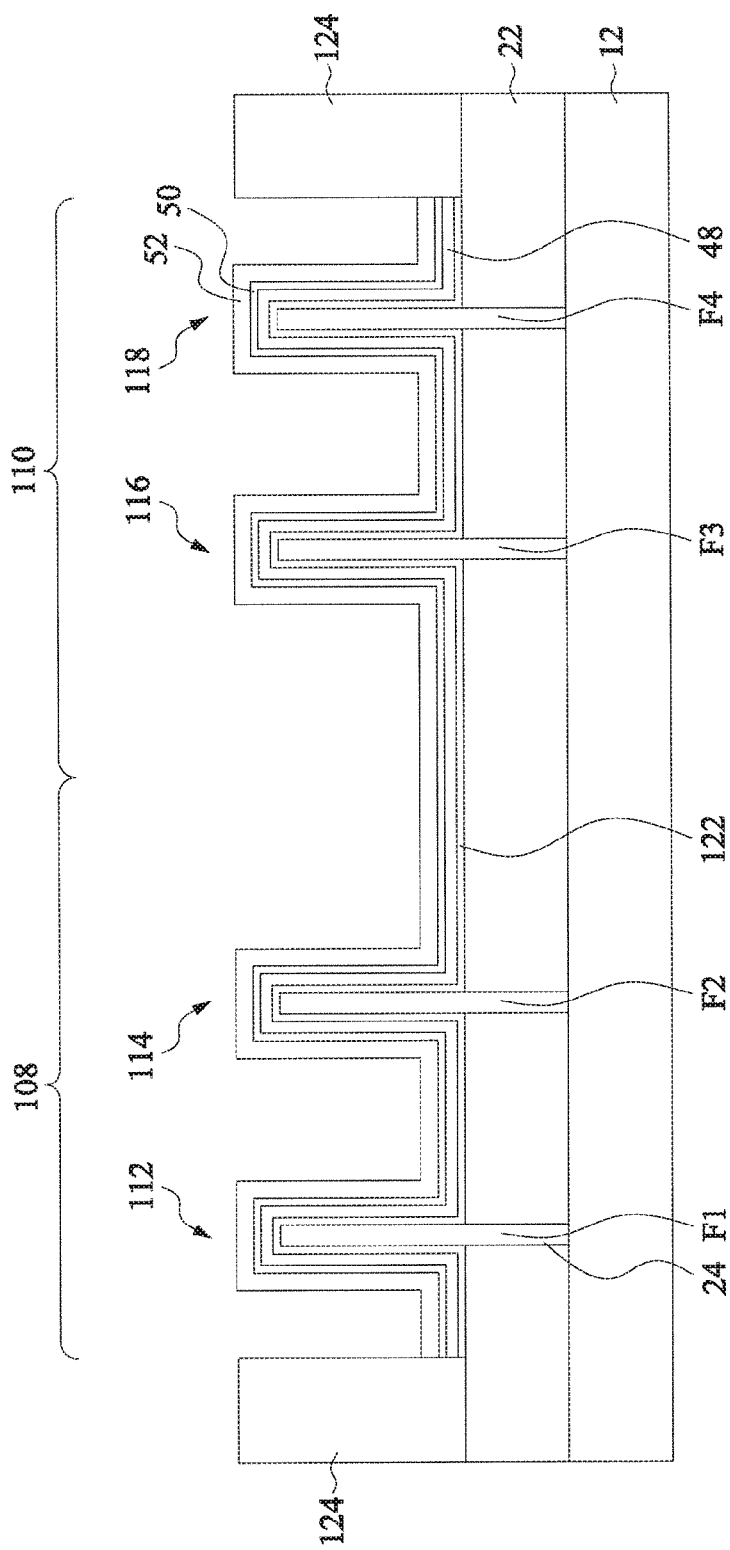

For the purposes of explaining this embodiment, manufacturing operations for four transistors are illustrated in the following disclosure, however, the present disclosure is not limited to a semiconductor device having four transistors. As shown in FIG. 8, in certain embodiments a plurality of fins are disposed in a first region 108 defined on a semiconductor substrate 12, including fins for P-type field effect transistors, and a plurality of fins are disposed in a second region 110 defined on the semiconductor substrate 12, including fins for N-type field effect transistors. For example in this embodiment, a first portion 112 of the first region 108 includes a first fin F1 for a P-type ultra low threshold voltage (PuLVT) transistor, and a second portion 114 of the first region 108 includes a second fin F2 for a P-type standard threshold voltage transistor (PSVT), whereas, a first portion 116 of the second region 110 includes a third fin F3 for an N-type standard threshold voltage transistor (NSVT), and a second portion 118 of the second region 110 includes a fourth fin F4 for an N-type ultra low threshold voltage transistor (NuLVT). The sequence of the four different types of transistors is not important. Although, a PuLVT, PSVT, NSVT, and NuLVT from left to right are illustrated, the sequence can be random. For example, the left to right sequence is NuLVT, PSVT, PuLVT, and NSVT in certain embodiments.

After the dummy gate electrode 30 and dummy gate dielectric layer 32 are removed, a high-k dielectric layer 122 is formed by depositing a high-k dielectric over the fins 24 in the gate space formed in the interlayer dielectric layer 124. According to embodiments of the disclosure, the high-k gate dielectrics include one or more layers of metal oxides. Examples of metal oxides used for high-k dielectrics include oxides of Li, Be, Mg, Ca, Sr, Sc, Y, Zr, HF, Al, La, Ce, Pr, Nd, Sm, Eu, Gd, Tb, Dy, Ho, Er, Tm, Yb, Lu, and/or mixtures thereof. In certain embodiments, the high-k dielectric includes: $HfO_2$, HfSiO, HfSiON, HfTaO, HfTiO, HfZrO, $ZrO_2$, $Al_2O_3$, and hafnium dioxide-alumina ($HfO_2$—$Al_2O_3$) alloy. In some embodiments, the thickness of the high-k dielectric layer 122 is in a range of about 5 nm to about 20 nm, and in a range of about 5 nm to about 10 nm in other embodiments. The gate dielectric layer may be deposited by any suitable process, including CVD, PVD, or ALD.

In certain embodiments, the metal gate electrodes include one or more work function adjustment layers. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the N-type FETs 116, 118, one or more of TaN, TaAlC, TiN, TiC, Co, TiAl, HfTi, TiSi and TaSi is used as the work function adjustment layer, and for the P-type FETs 112, 114, one or more of TiAlC, Al, TiAl, TaN, TaAlC, TiN, TiC and Co is used as the work function adjustment layer. In the present embodiment, a first work function adjustment layer 48 and a second work function adjustment layer 50 are disposed over the high-k dielectric layer 122. A first work function adjustment material for the first work function adjustment layer 48 and a second work function adjustment material for the second work function adjustment layer 50 are different materials. For example, the first work function adjustment material may be TiN, while the second work function adjustment material may be TaN. The work function adjustment layers are formed to a thickness of about 1 nm to 10 nm in certain embodiments, and to a thickness of about 1 nm to about 4 nm in other embodiments.

An optional thin hard mask 52 is deposited over the second work function adjustment layer 50, as shown in FIG. 8. The thin hard mask 52 can protect the fin top from damage during subsequent processing. The thin hard mask 52 may be made of a suitable hard mask material, including SiO$_2$, SiN, and SiCN, or a suitable metal material, such as TiN and TaN. The thin hard mask is a different material than the second work function adjustment layer 50. The thin hard mask 52 may be formed by any suitable process, including CVD and PVD. The thin hard mask 52 may be deposited to a thickness of about 1 nm to about 10 nm.

Figure 9:
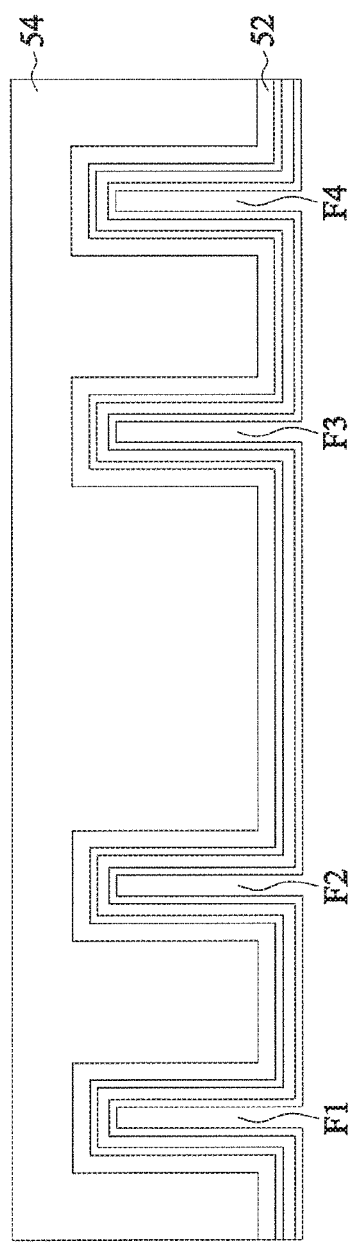

To simplify the following disclosure, the substrate 12, isolation insulating layer 22, and interlayer dielectric layer 124, are omitted from FIGS. 9-19. As shown in FIG. 9, a hard mask 54 is formed over the first region 108 and second region 110 covering the first, second, third, and fourth fins F1, F2, F3, F4. The hard mask 54 may be made of a suitable hard mask material, including SiO$_2$, SiN, and SiCN, or a suitable metal material, such as TiN and TaN. The hard mask 54 may be formed by any suitable process, including CVD and PVD. The hard mask 54 is formed to a thickness to completely cover the first, second, third, and fourth fins F1, F2, F3, F4, as shown in FIG. 9. The hard mask 54 is thicker than the optional thin hard mask 52. The hard mask 54 may be subsequently planarized.

The hard mask 54 is subsequently removed from the first region 108. In some embodiments the hard mask 54 is removed by photolithographic and etching operations. As shown in FIG. 10, in some embodiments, a photoresist and bottom anti-reflective coating (BARC) layer 58 are deposited on the hard mask 54, the photoresist is patterned to expose the hard mask 54 on the first region 108, and the exposed hard mask 54 is etched using a suitable etching operation, such as dry or wet etching. The thin hard mask 52, if present, is subsequently removed by etching, as shown in FIG. 11. As the purpose of the thin hard mask 52 is to function as a sacrificial layer, if the etch selectivity of the hard mask 54 toward the second work function adjustment layer 50 is acceptable, the deposition and subsequent etching away of the thin hard mask 52 is not necessary. Subsequently, the photoresist and BARC layer 58 is removed by a suitable stripping or ashing operation.

Adverting to FIG. 12, after the photoresist and BARC layer 58 is removed, a first conductive material layer 60 is formed over the first region 108 and the second region 110. The first conductive material layer 60 may include one or more layers of W, Ti, TiN, titanium-aluminum alloy, Al, AN, Ta, TaN, TaC, TaCN, TaSi, NiSi, CoSi, and other conductive metals. The first conductive material layer 60 may be formed to a thickness of about 1 nm to about 10 nm. The first conductive material layer 60 may be deposited by any suitable process, including CVD, PVD, ALD, and electroplating.

The first conductive material layer 60 is subsequently removed over the second region 110 and from a portion 66 of the first region 108. As shown in FIG. 13, the first conductive material layer is removed in some embodiments by forming a photoresist and BARC layer 64 over the first and second regions 108, 110, and patterning the photoresist using photolithographic and etching operations to expose the portion 66 of the first region 108 and the second region 110. The first conductive material layer 60 is subsequently removed from the portion 66 of the first region 108 and the second region 110, leaving another portion of the first conductive material layer 60 remaining on the first region 110 covered by the photoresist and BARC layer 64. Subsequently, the photoresist and BARC layer 64 is removed by a suitable stripping or ashing operation.

A second conductive material layer 68 is subsequently formed over the first and second fins F1, F2 in the first region 108 and over the third and fourth fins F3, F4, in the second region 110, as depicted in FIG. 14. The second conductive material layer may include one or more layers of W, Ti, TiN, titanium-aluminum alloy, Al, AN, Ta, TaN, TaC, TaCN, TaSi, NiSi, CoSi, and other conductive metals. The second conductive material layer 68 is formed of the same or different material than the first conductive material layer 60. The first and second conductive material layers can be the same material because conductive material thickness also influences threshold voltage. When the materials are the same, the threshold voltage of the different transistors are adjusted by varying the thicknesses of the conductive material layers. For example, the combined thicknesses of the first and second conductive material layers 60, 68 of the PuLVT is greater than the thickness of the first conductive material layer 60 of the PSVT. The second conductive material layer 68 may be formed to a thickness of about 1 nm to about 10 nm. The second conductive material layer 68 may be deposited by any suitable process, including CVD, PVD, ALD, and electroplating.

The first and second conductive materials are not limited. Any combination of conductive materials which provide the desired threshold voltage can be used. For example, in a certain embodiment, the PSVT has a first conductive material layer 60 of 1 nm thick TiN, and the PuLVT has a first conductive material layer of 1 nm thick TiN and a second conductive material layer 68 of either 1 nm thick TiN, TiSiN, or TiAlC.

A first metal gate fill material 70 is subsequently formed over the first region 108. The first metal gate fill material 70 is deposited over both the first region 108 and the second region 110 in certain embodiments. The device is subsequently planarized, thereby removing the first metal gate fill material and the second conductive material layer overlying the second region 110, as illustrated in FIG. 15. The device can be planarized by any suitable planarization process, including CMP and etch back operations. After planarization, a portion of the second conductive material layer 68 extends along an edge of the hard mask 54 covering the third and fourth fins. The first metal gate fill material 70 may include one or more layers of W, Ti, TiN, titanium-aluminum alloy, Al, AN, Ta, TaN, TaC, TaCN, TaSi, NiSi, CoSi, and other conductive metals. In certain embodiments, the first metal gate fill material is tungsten. The first metal gate fill material 70 may be deposited by any suitable process, including CVD, PVD, ALD, and electroplating.

Figure 16:
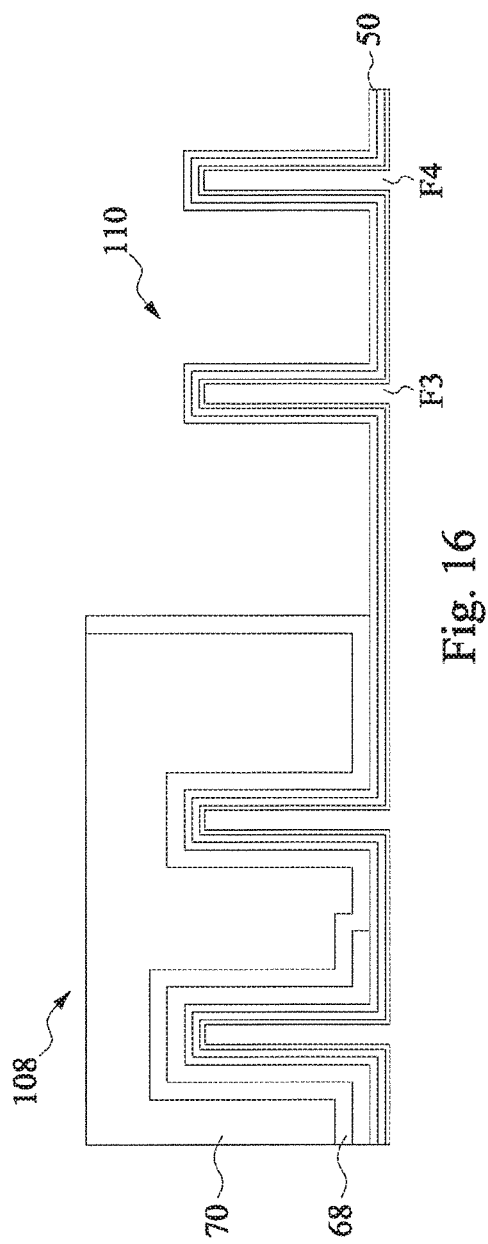
Figure 17:
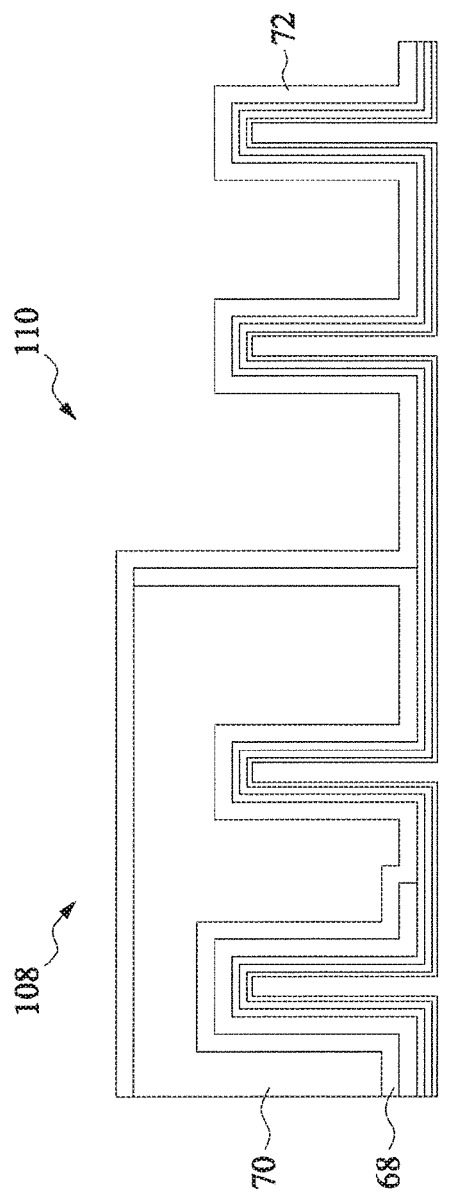

Adverting to FIG. 16, the hard mask 54 and the thin hard mask 52, if present, covering the third and fourth fins F3, F4 are subsequently removed from the second region 110. In some embodiments the hard mask 54 and the thin hard mask 52 are removed by photolithographic and etching operations. In certain embodiments, the photolithographic operations are not necessary when the etch selectivity of the hard mask 54 to the metal gate fill material is acceptable As shown in FIG. 17, a third conductive material layer 72 is formed over the third and fourth fins in the second region 110, and over the first region 108. The third conductive material layer 72 may include one or more layers of W, Ti, TiN, titanium-aluminum alloy, Al, AN, Ta, TaN, TaC, TaCN, TaSi, NiSi, CoSi, and other conductive metals. The third conductive material layer 72 may be formed to a thickness of about 1 nm to about 10 nm. The third conductive material layer 72 may be deposited by any suitable process, including CVD, PVD, ALD, and electroplating.

The third conductive material layer 72 is subsequently removed from a portion 78 of the second region 110. As shown in FIG. 18, the third conductive material layer is removed in some embodiments by forming a photoresist and BARC layer 76 over the first and second regions 108, 110, and patterning the photoresist using photolithographic and etching operations to expose the portion 78 of the second region 110 where the fourth fin F4 is formed. The third conductive material layer 72 is subsequently removed by a suitable etching operation from the second portion 78 of the second region 110 covering the fourth fin F4, and leaving the third conductive material layer 72 covering the third fin F3 in the first portion of the second region 110 and the first region 108 covered by the photoresist 76. The photoresist and BARC layer 76 is subsequently removed by a suitable stripping or ashing operation, and the third conductive material layer 72 is removed by a suitable etching operation in certain embodiments.

The gate electrode in the second region 110 is formed as shown in FIG. 19 in some embodiments. A fourth conductive material layer 79 is formed over the first region 108 and the second region 110. The fourth conductive material layer may include one or more layers of W, Ti, TiN, titanium-aluminum alloy, Al, AN, Ta, TaN, TaC, TaCN, TaSi, NiSi, CoSi, and other conductive metals. The fourth conductive material layer 79 is formed of the same or different material than the third conductive material layer 72. The third and fourth conductive material layers can be the same material because conductive material layer thickness also influences threshold voltage. When the materials are the same, the threshold voltage of the different transistors are adjusted by varying the thicknesses of the conductive material layers. The fourth conductive material layer 79 may be formed to a thickness of about 1 nm to about 10 nm. The fourth conductive material layer 79 may be deposited by any suitable process, including CVD, PVD, ALD, and electroplating.

After the fourth conductive material layer 79 is deposited, a second metal gate fill material 80 is subsequently formed over the second region 110. The second metal gate fill material 80 is deposited over both the first region 108 and the second region 110 in certain embodiments. The device is subsequently planarized, thereby removing the second metal gate fill material and the third and fourth conductive material layers overlying the first region 110, as illustrated in FIG. 19. The device can be planarized by any suitable planarization process, including CMP and etch back operations. The second metal gate fill material 80 may include one or more layers of W, Ti, TiN, titanium-aluminum alloy, Al, AN, Ta, TaN, TaC, TaCN, TaSi, NiSi, CoSi, and other conductive metals. The second metal gate fill material 80 may be the same or different from the first metal gate fill material 70. In certain embodiments, the second metal gate fill material is tungsten. The second metal gate fill material 80 may be deposited by any suitable process, including CVD, PVD, ALD, and electroplating.

In certain embodiments, a portion of the third conductive material layer 72 is immediately adjacent the portion of the first conductive material layer 68 that extended along the edge of the hard mask 54 covering the third and fourth fins. In certain embodiments, the first metal gate fill material 70 and the second metal gate fill material 80 are separated from each other by the third conductive material layer 72 and the fourth conductive material layer 79 and there is no conductive material layer between the first metal gate fill material 70 and the second metal gate fill material 80 that overlies both the first region 108 and the second region 110. In certain embodiments, the first metal gate fill material 70 and the second metal gate fill material 80 are separated from each other by the first conductive material layer 68, third conductive material layer 72, and the fourth conductive material layer 79 and there is no conductive material layer between the first metal gate fill material 70 and the second metal gate fill material 80 that overlies both the first region 108 and the second region 110.

It is understood that additional operations can be provided before, during, and after processes shown by FIGS. 8-19, and some of the operations described above can be replaced or eliminated for additional embodiments of the method. The order of the operations/processes may be interchangeable. It is further understood that the device shown in FIG. 19 undergoes further CMOS processes to form various features such as interconnect metal layers, dielectric layers, passivation layers, etc.

FIGS. 20-27 show another process for forming a multi-gate semiconductor device according to an embodiment of the present disclosure. FIGS. 20-27 are cross section views taken along the Y-Y' direction of the semiconductor device 10 (see FIG. 6). This cross section view shows the region 36 where the gate electrode is formed.

Figure 20:
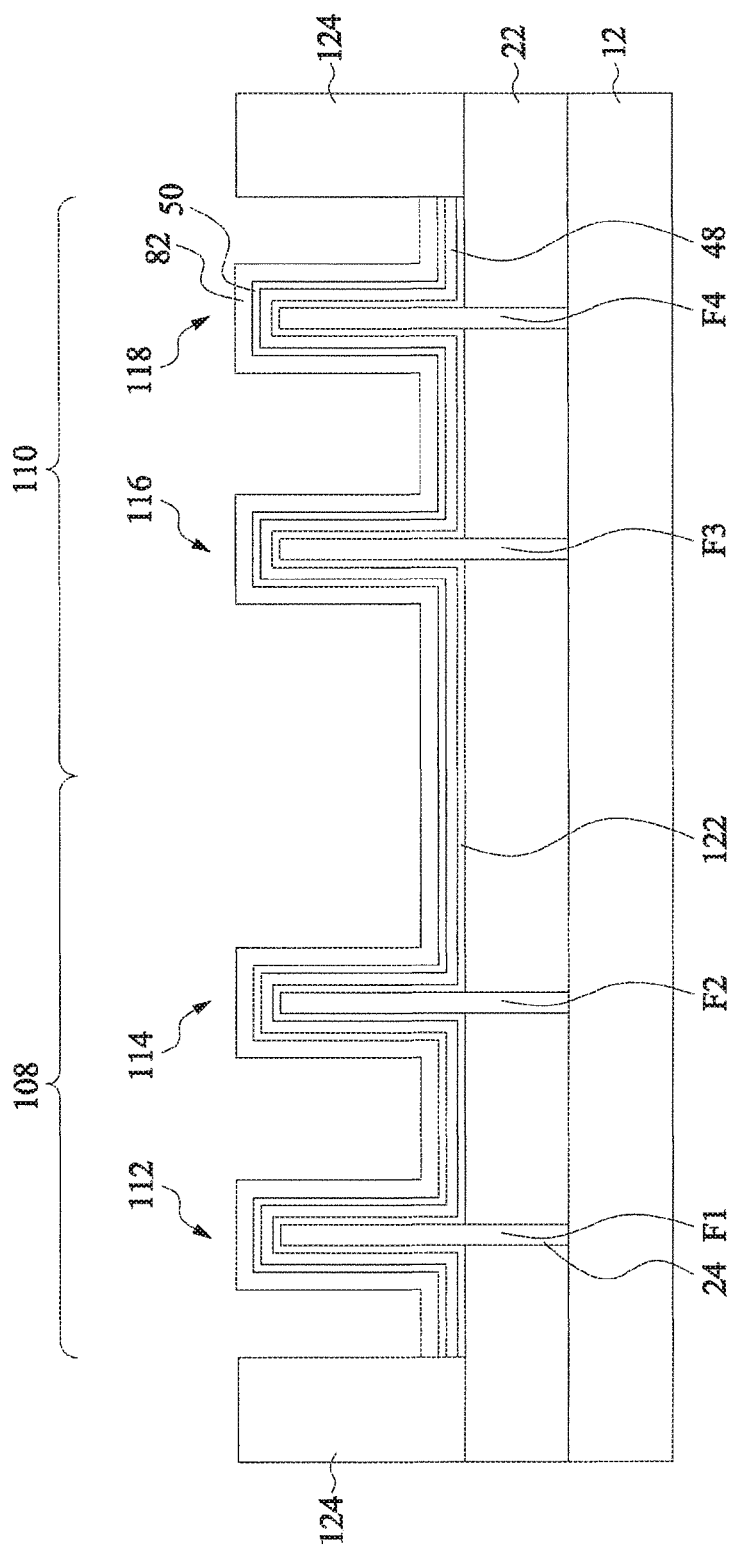
FIGS. 20-27 show a process for forming a multigate semiconductor device according to an embodiment of the present disclosure.

For the purposes of explaining this embodiment, the four transistors illustrated in FIG. 20 and described in the following disclosure are the same as in the embodiment described in FIG. 8, wherein the first region 108 defined on the semiconductor substrate 12 includes P-type field effect transistors and the second region 110 includes N-type field effect transistors having a high-k dielectric and metal gate electrodes. As previously discussed regarding FIG. 8, a high-k gate dielectric layer 122 is formed by depositing a high-k dielectric over the fins 24, and one or more work function adjustment layers 48, 50 are formed over the high-k gate dielectric layer 122 formed in a gate space in the interlayer dielectric layer 124, in certain embodiments. A first conductive material layer 82 is subsequently formed over the first region 108 and the second region 110. The first conductive material layer may include one or more layers of W, Ti, TiN, titanium-aluminum alloy, Al, AN, Ta, TaN, TaC, TaCN, TaSi, NiSi, CoSi, and other conductive metals. The first conductive material layer 82 may be formed to a thickness of about 1 nm to about 10 nm. The first conductive material layer 82 may be deposited by any suitable process, including CVD, PVD, ALD, and electroplating. Unlike the embodiment of FIGS. 8-19, a separate hard mask 54 is not used in this embodiment. In this embodiment, the conductive material layers (e.g., layer 82) also function as a hard mask in protecting the fins 24 from damage during subsequent processing.

Figure 21:
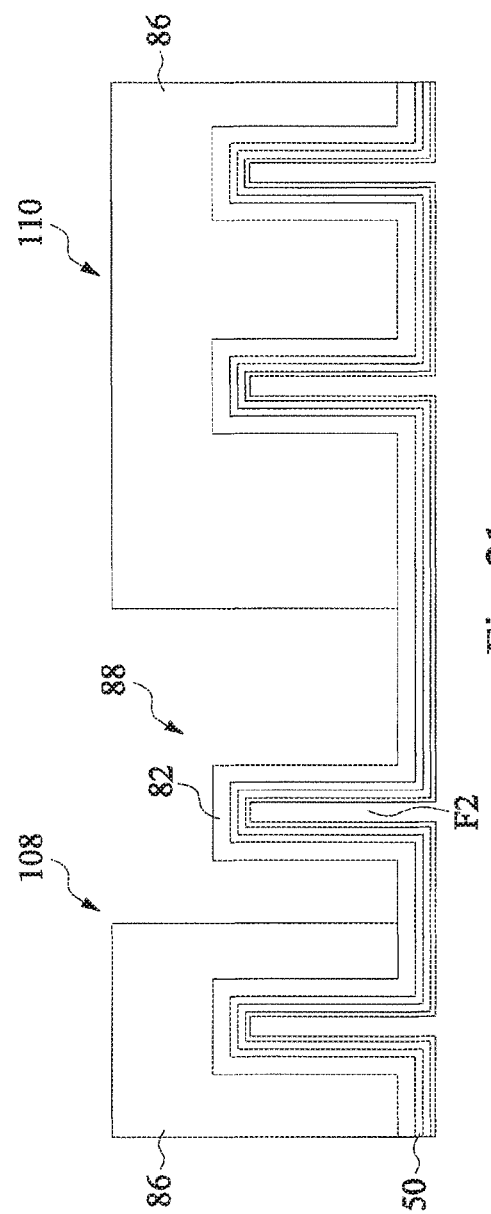

To simplify the following disclosure, the substrate 12, isolation insulating layer 22, high-k gate dielectric layer 122, and interlayer dielectric layer 124, are omitted from FIGS. 21-27. The first conductive material layer 82 is subsequently removed from a portion 88 of the first region 108. As shown in FIG. 21, the first conductive material layer is removed in some embodiments by forming a photoresist and BARC layer 86 over the first and second regions 108, 110, and patterning the photoresist using photolithographic and etching operations to expose a portion 88 of first conductive material layer 82 in the first region 108 covering the second fin F2. The exposed portion of the first conductive material layer 82 is subsequently removed from the first region 108, leaving another portion of the first conductive material layer 82 remaining on the first region 108 and the second region 110 covered by the photoresist 86. Subsequently, the photoresist and BARC layer is removed by a suitable stripping or ashing operation.

Figure 22:
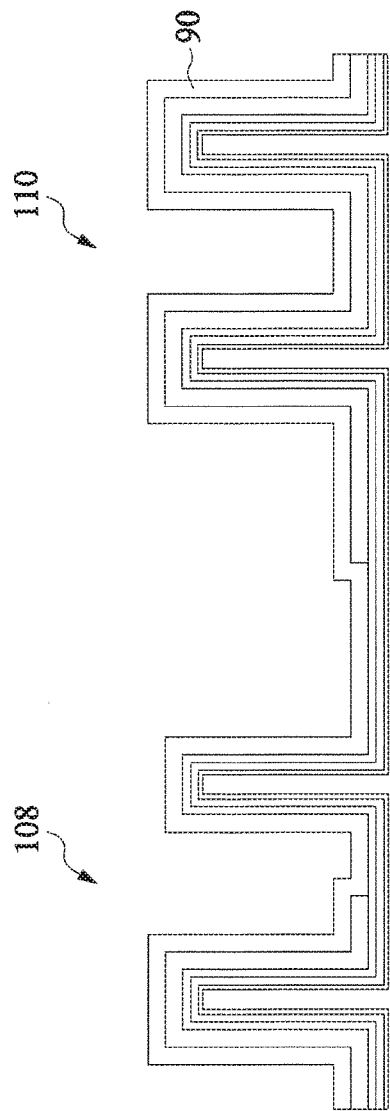

After removing the photoresist and BARC layer 86, a second conductive material layer 90 is subsequently formed over the first and second fins F1, F2 in the first region 108 and the third and fourth fins F3, F4 in the second region 110, as depicted in FIG. 22. The second conductive material layer 90 may include one or more layers of W, Ti, TiN, titanium-aluminum alloy, Al, AN, Ta, TaN, TaC, TaCN, TaSi, NiSi, CoSi, and other conductive metals. The second conductive material layer 90 is formed of the same or different material than the first conductive material layer 82. The first and second conductive material layers can be the same material because conductive material thickness also influences threshold voltage. When the materials are the same, the threshold voltage of the different transistors are adjusted by varying the thicknesses of the conductive material layers. For example, the combined thicknesses of the first and second conductive material layers 82, 90 of the PuLVT is greater than the thickness of the first conductive material layer 82 of the PSVT. The second conductive material layer 90 may be formed to a thickness of about 1 nm to about 10 nm. The second conductive material layer 90 may be deposited by any suitable process, including CVD, PVD, ALD, and electroplating.

The first and second conductive materials are not limited. Any combination of conductive materials which provide the desired threshold voltage can be used. For example, in a certain embodiment, the PSVT has a first conductive material layer 82 of 1 nm thick TiN, and the PuLVT has a first conductive material layer of 1 nm thick TiN and a second conductive material layer 90 of either 1 nm thick TiN, TiSiN, or TiAlC.

Figure 23:
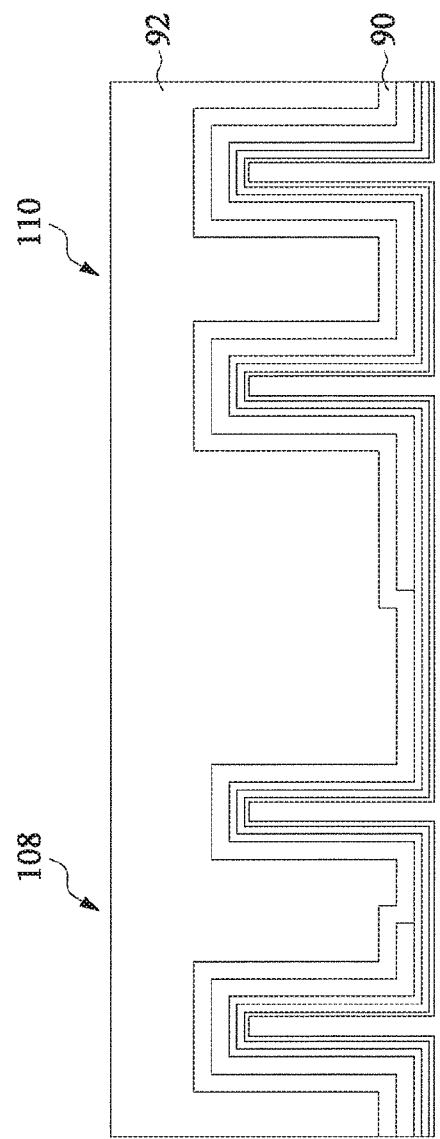

A first metal gate fill material 92 is subsequently formed over the first region 108 and the second region 110 covering the first, second, third, and fourth fins F1, F2, F3, F4, as illustrated in FIG. 23. The first metal gate fill material 92 may include one or more layers of W, Ti, TiN, titanium-aluminum alloy, Al, AN, Ta, TaN, TaC, TaCN, TaSi, NiSi, CoSi, and other conductive metals. In certain embodiments, the first metal gate fill material is tungsten. The first metal gate fill material 92 may be deposited by any suitable process, including CVD, PVD, ALD, and electroplating.

Figure 24:
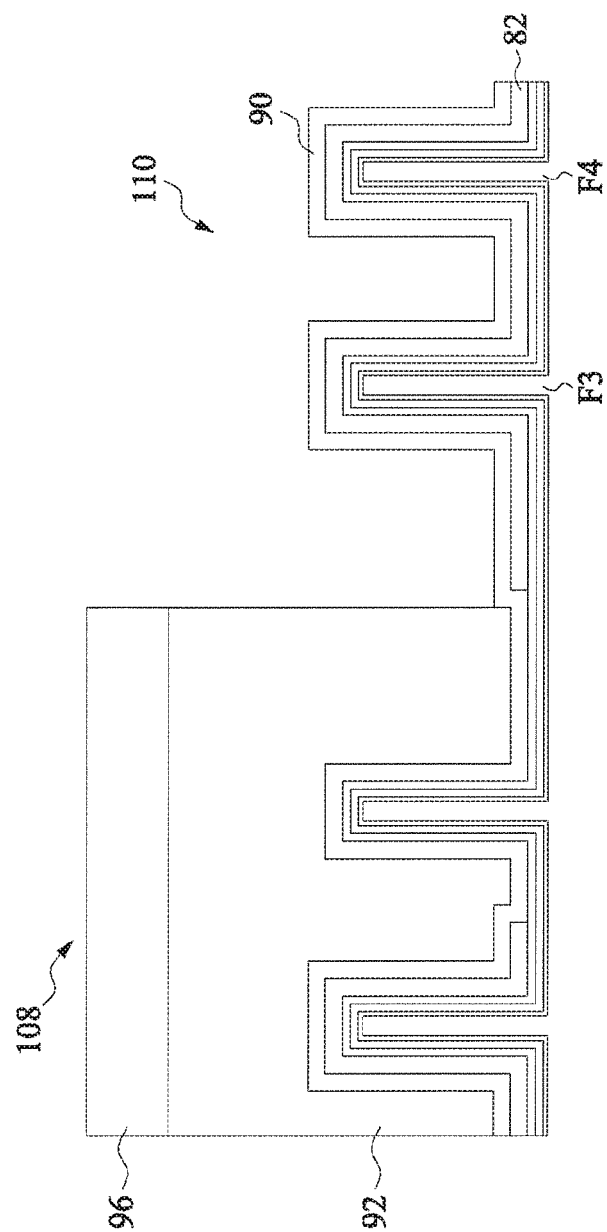

The first metal gate fill material 92 is subsequently removed from the third and fourth fins F3, F4 in the second region 110. As shown in FIG. 24, the first metal gate fill material 92 is removed in some embodiments by forming a photoresist and BARC layer 96 over the first and second regions 108, 110, and patterning the photoresist using photolithographic and etching operations to remove the first metal gate fill material 92 covering the third and fourth fins F3, F4 in the second region 110.

Figure 25:
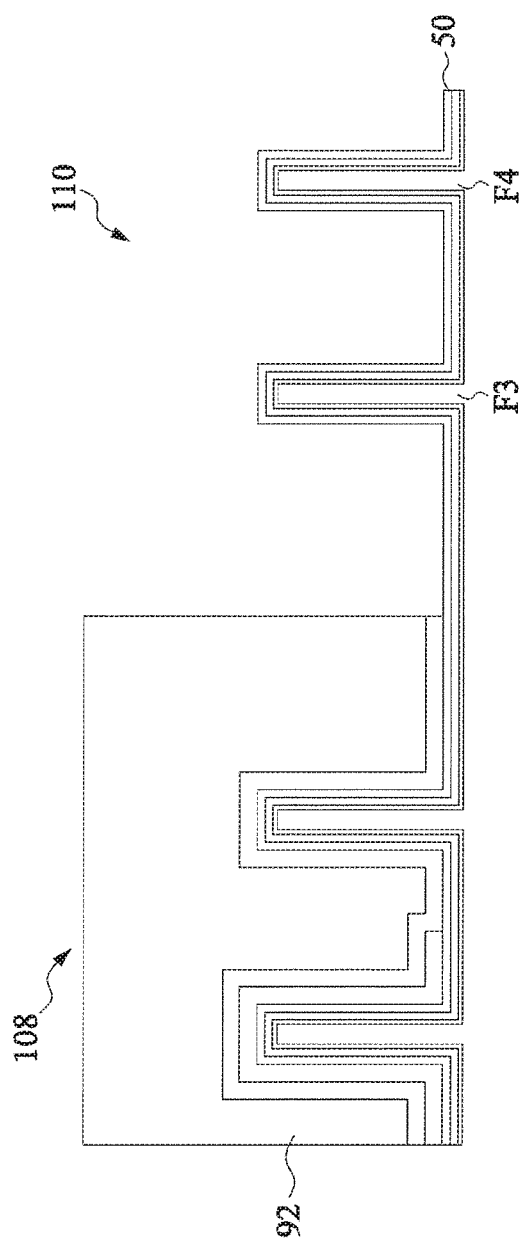

The first conductive material layer 82 and the second conductive material layer 90 in the second region 110 are removed by a suitable etching operation, as shown in FIG. 25. The photoresist and BARC layer 96 is subsequently removed by a suitable stripping or ashing operation in certain embodiments to expose the first metal gate fill material 82 in the first region.

Figure 26:
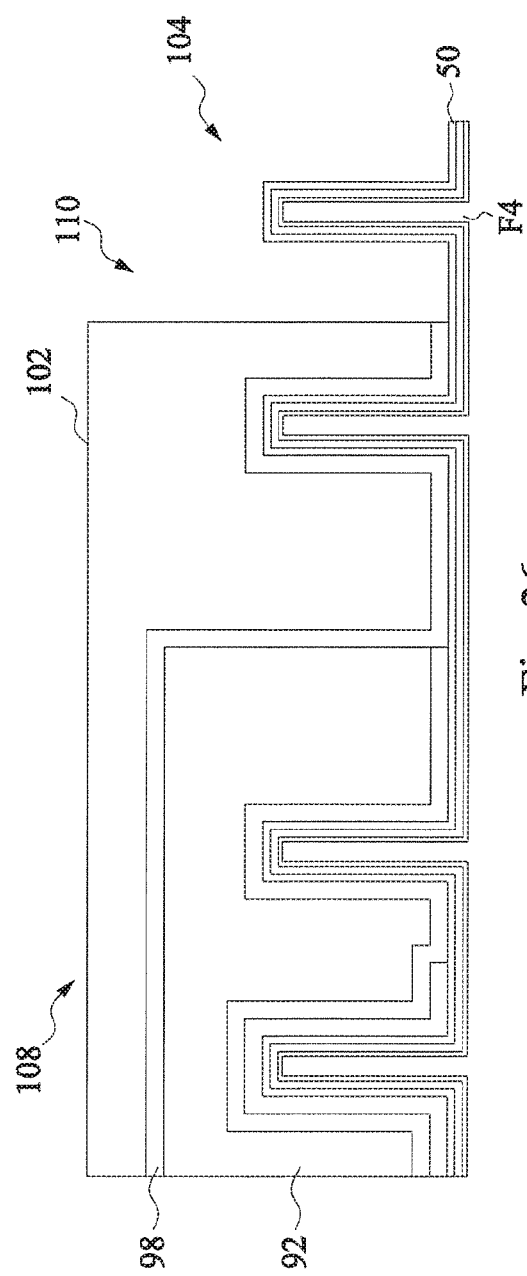

As shown in FIG. 26, a third conductive material layer 98 is formed over the first region 108 and the third and fourth fins F3, F4 in the second region 110. After depositing the third conductive material layer 98 over the first region 108 and the second region 110, a photoresist and BARC layer 102 is deposited over the third conductive material layer 98. The photoresist and BARC layer 102 is patterned using photolithographic operations to expose a portion 104 of the second region 110 including the fourth fin F4, and a portion of the third conductive material layer covering the fourth fin F4 in the exposed portion 104 is subsequently removed by a suitable etching operation, leaving the third conductive material layer 98 remaining in another portion of the second region 110 covered by the photoresist 102. The third conductive material layer 98 may include one or more layers of W, Ti, TiN, titanium-aluminum alloy, Al, AN, Ta, TaN, TaC, TaCN, TaSi, NiSi, CoSi, and other conductive metals. The third conductive material layer 98 may be formed to a thickness of about 1 nm to about 10 nm. The third conductive material layer 98 may be deposited by any suitable process, including CVD, PVD, ALD, and electroplating. The photoresist and BARC layer 102 is subsequently removed by a suitable stripping or ashing operation in certain embodiments.

Figure 27:
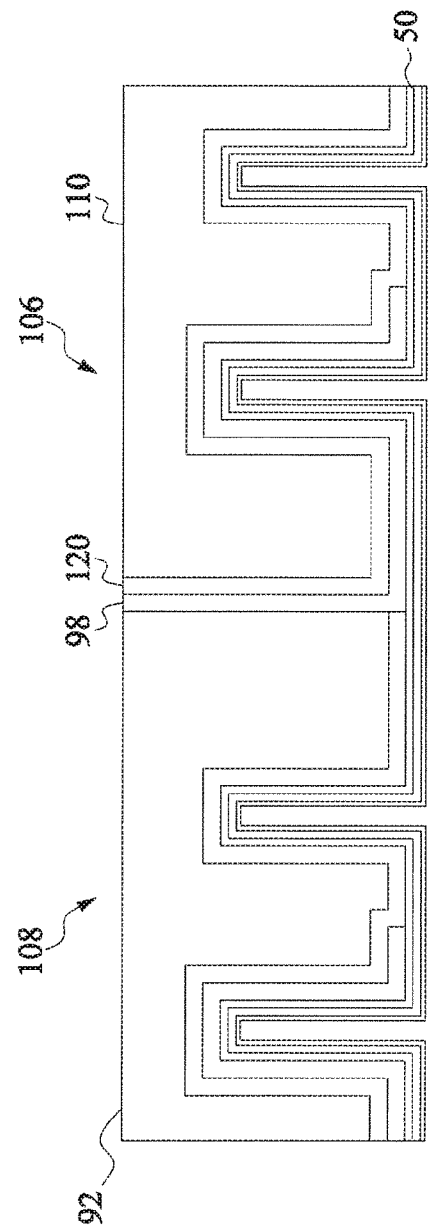

The gate electrode in the second region 110 is formed as shown in FIG. 27 in some embodiments. A fourth conductive material layer 120 is formed over the third and fourth fins F3, F4 in the second region 110. The fourth conductive material layer may include one or more layers of W, Ti, TiN, titanium-aluminum alloy, Al, AN, Ta, TaN, TaC, TaCN, TaSi, NiSi, CoSi, and other conductive metals. The fourth conductive material layer 120 is formed of the same or different material than the third conductive material layer 98. The third and fourth conductive material layers 98, 120 can be the same material because conductive material layer thickness also influences threshold voltage. When the materials are the same, the threshold voltage of the different transistors are adjusted by varying the thicknesses of the conductive material layers. The fourth conductive material layer 120 may be formed to a thickness of about 1 nm to about 10 nm. The fourth conductive material layer 120 may be deposited by any suitable process, including CVD, PVD, ALD, and electroplating.

After the fourth conductive material layer 120 is deposited, a second metal gate fill material 106 is subsequently formed over the second region 110. The second metal gate fill material 106 is deposited over both the first region 108 and the second region 110 in certain embodiments. The device is subsequently planarized, thereby removing the second metal gate fill material and the third and fourth conductive material layers overlying the first region 110, as illustrated in FIG. 27. The device can be planarized by any suitable planarization process, including CMP and etch back operations. The second metal gate fill material 106 may include one or more layers of W, Ti, TiN, titanium-aluminum alloy, Al, AN, Ta, TaN, TaC, TaCN, TaSi, NiSi, CoSi, and other conductive metals. The second metal gate fill material 106 may be the same or different from the first metal gate fill material 92. In certain embodiments, the second metal gate fill material is tungsten. The second metal gate fill material 106 may be deposited by any suitable process, including CVD, PVD, ALD, and electroplating.

A portion of the third conductive material layer 98 extends along an edge of the first metal gate fill material 92, and a portion of the fourth conductive material layer 120 extends along the portion of the third conductive material layer 98 that extends along the edge of the first metal gate fill material 92, in some embodiments. In certain embodiments, the first metal fill material 92 and the second metal gate fill material 110 are separated from each other by the third conductive material layer 98 and the fourth conductive material layer 120 and there is no conductive material layer between the first metal gate fill material 92 and the second metal gate fill material 110 that overlies both the first region 108 and the second region 110.

It is understood that additional operations can be provided before, during, and after processes shown by FIGS. 20-27, and some of the operations described above can be replaced or eliminated for additional embodiments of the method. The order of the operations/processes may be interchangeable. It is further understood that the device shown in FIG. 27 undergoes further CMOS processes to form various features such as interconnect metal layers, dielectric layers, passivation layers, etc.

According to embodiments of the present disclosure, adjacent gates of a multigate device are separated from each other by the third metal layer 72, 98 and the fourth metal layer 79, 120. Semiconductor devices according to the present disclosure do not require a boundary formed of a nitride, such as TaN, between adjacent gate electrodes. In certain embodiments, there are no conductive layers separating adjacent gate electrodes that also cover the fins of adjacent transistors.

It is understood that additional operations can be provided before, during, and after processes shown by FIGS. 20-27, and some of the operations described above can be replaced or eliminated for additional embodiments of the method. The order of the operations/processes may be interchangeable. It is further understood that the device shown in FIG. 27 undergoes further CMOS processes to form various features such as interconnect metal layers, dielectric layers, passivation layers, etc.

FIGS. 28-32 show another process for forming a multigate semiconductor device according to an embodiment of the present disclosure. FIGS. 28-32 are cross section views taken along the Y-Y' direction of the semiconductor device 10 (see FIG. 6). This cross section view shows the region 36 where the gate electrode is formed.

Figure 28:
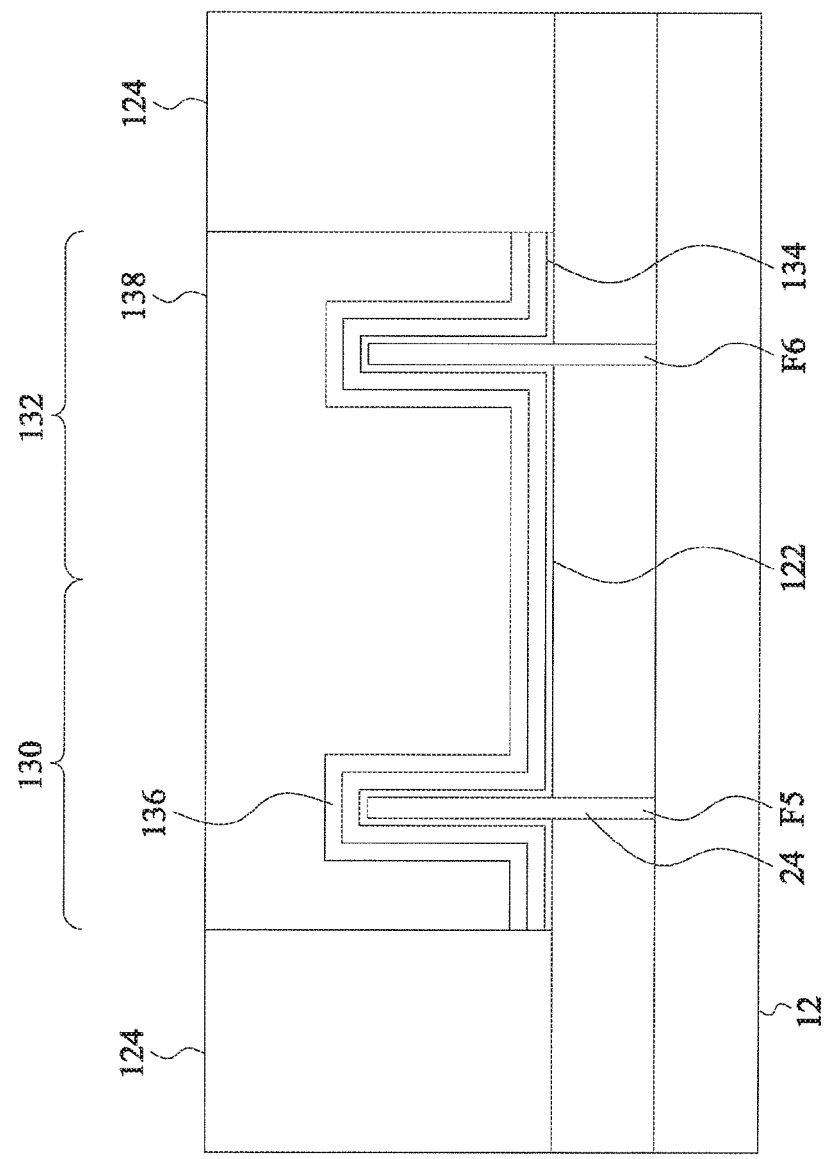
FIGS. 28-32 show a process for forming a multigate semiconductor device according to an embodiment of the present disclosure.

For the purposes of explaining this embodiment, two transistors, including a first field effect transistor (FET) having a first fin F5 and a second FET having a second fin F6 are shown in FIG. 28. The first FET is formed in a first region 130 defined on the semiconductor substrate 12, and the second FET is formed in a second region 132. In certain embodiments the first FET is a PFET and the second FET is an NFET. A high-k gate dielectric layer 122 is formed in a gate space between interlayer dielectric layers 124 by depositing a high-k dielectric over the fins 24. A first work function layer 134 is formed covering the high-k gate dielectric layer 122 covering the first fin F5 and the second fin F6. A second work function adjustment layer 136 is formed covering the first and second fins F5, F6 in some embodiments. In certain embodiments, the second work function adjustment layer 136 also covers the first work function adjustment layer 134.

According to embodiments of the disclosure, the high-k gate dielectrics include one or more layers of metal oxides. As explained above, examples of metal oxides used for high-k dielectrics include oxides of Li, Be, Mg, Ca, Sr, Sc, Y, Zr, HF, Al, La, Ce, Pr, Nd, Sm, Eu, Gd, Tb, Dy, Ho, Er, Tm, Yb, Lu, and/or mixtures thereof. In certain embodiments, the high-k dielectric includes: $HfO_2$, HfSiO, HfSiON, HfTaO, HfTiO, HfZrO, $ZrO_2$, $Al_2O_3$, and hafnium dioxide-alumina ($HfO_2$—$Al_2O_3$) alloy. In some embodiments, the thickness of the high-k gate dielectric layer 122 is in a range of about 5 nm to about 20 nm, and in a range of about 5 nm to about 10 nm in other embodiments. The gate dielectric layer may be deposited by any suitable process, including CVD, PVD, or ALD.

In certain embodiments, the first and second work function adjustment layers include one or more layers of a conductive material such as a single layer of TiN, TaN, TaAlC, TiC, TaC, Co, Al, TiAl, HfTi, TiSi, TaSi or TiAlC, or a multilayer of two or more of these materials. The first and second work function adjustment layers are formed of different materials. In certain embodiments, the first work function adjustment layer 136 is TaN and the second work function adjustment layer 134 is TiN. The first and second work function adjustment layers are each formed to a thickness of about 1 nm to 10 nm in certain embodiments, and to a thickness of about 1 nm to about 4 nm in other embodiments.

The mask 138 is a hard mask in certain embodiments, and is formed of a suitable hard mask material, including $SiO_2$, SiN, and SiCN, or a suitable metal material, such as TiN and TaN. The mask 138 is formed of a different material than the barrier layer 136. The mask 138 may be formed by any suitable process, including CVD and PVD. The mask 138 is formed to a thickness to completely cover the first fin F5 in first region 130 and the second fin F6 in second region 132. The mask 138 may be subsequently planarized.

To simplify the disclosure, the substrate 12, insulating isolation layer 22, lower portions of the first and second fins F5, F6, the gate dielectric layer 122, and interlayer dielectric layer 124 are not shown in FIGS. 29-32.

Figure 29:
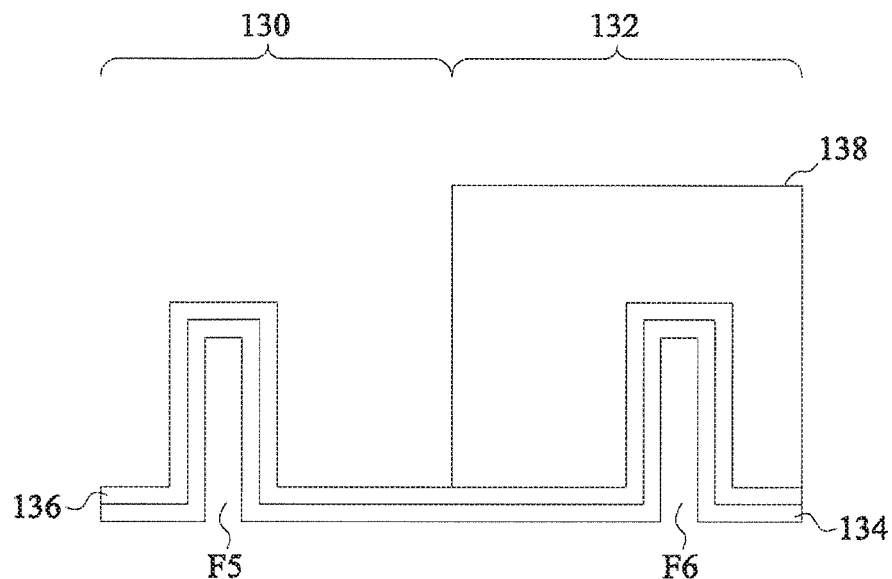

The mask 138 is removed from the first region 130 exposing the first work function adjustment layer 136 covering the first fin F5, as shown in FIG. 29. The mask 138 is removed by a suitable etching operation in some embodiments.

Figure 30:
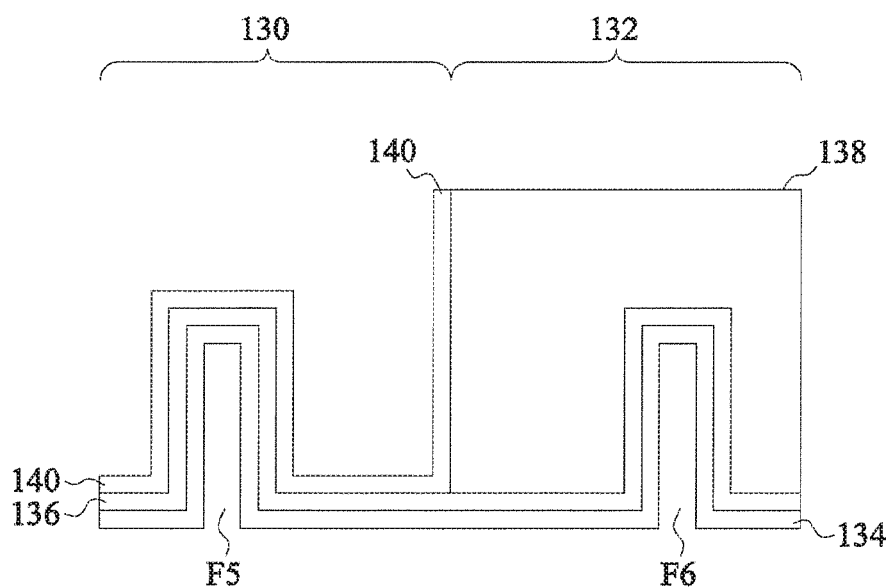

A first conductive material layer 140 is subsequently formed over the first region 130, as shown in FIG. 30. The first conductive material layer may include one or more layers of W, Ti, TiN, titanium-aluminum alloy, Al, AN, Ta, TaN, TaC, TaCN, TaSi, NiSi, CoSi, and other conductive metals. The first conductive material layer 140 may be formed to a thickness of about 1 nm to about 10 nm. The first conductive material layer 140 may be deposited by any suitable process, including CVD, PVD, ALD, and electroplating. In certain embodiments, the first conductive material adjustment layer 140 includes a portion of the first conductive material layer along an edge of the mask 138 covering the second fin F6.

Figure 31:
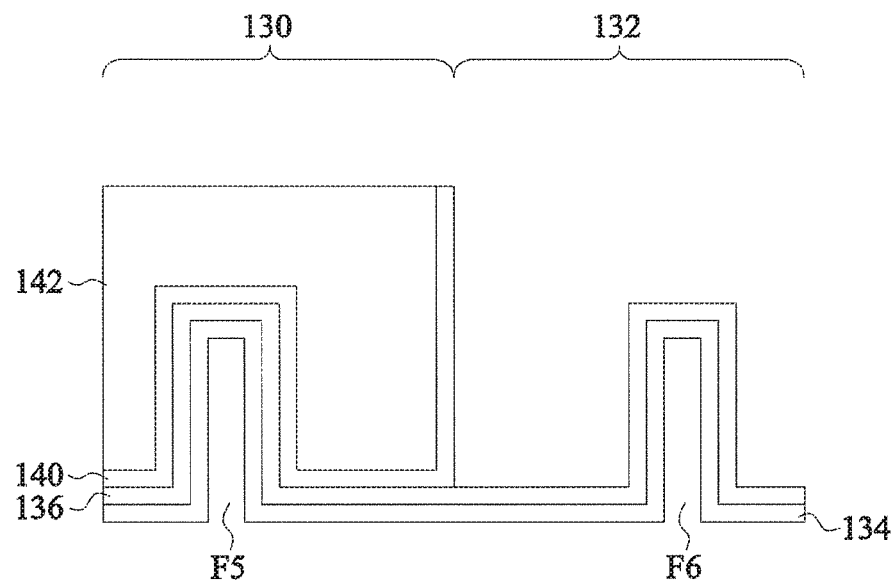

A first metal gate fill material 142 is subsequently formed over the first region 130, as illustrated in FIG. 31. The first metal gate fill material 142 may include one or more layers of W, Ti, TiN, titanium-aluminum alloy, Al, AlN, Ta, TaN, TaC, TaCN, TaSi, NiSi, CoSi, and other conductive metals. In certain embodiments, the first metal gate fill material is tungsten. The first metal gate fill material 142 may be deposited by any suitable process, including CVD, PVD, ALD, and electroplating.

After forming the first metal gate fill material 142, the mask 138 is removed from the second region 132 where the second fin F6 is formed exposing the second work function adjustment layer 136, as shown in FIG. 31.

Figure 32:
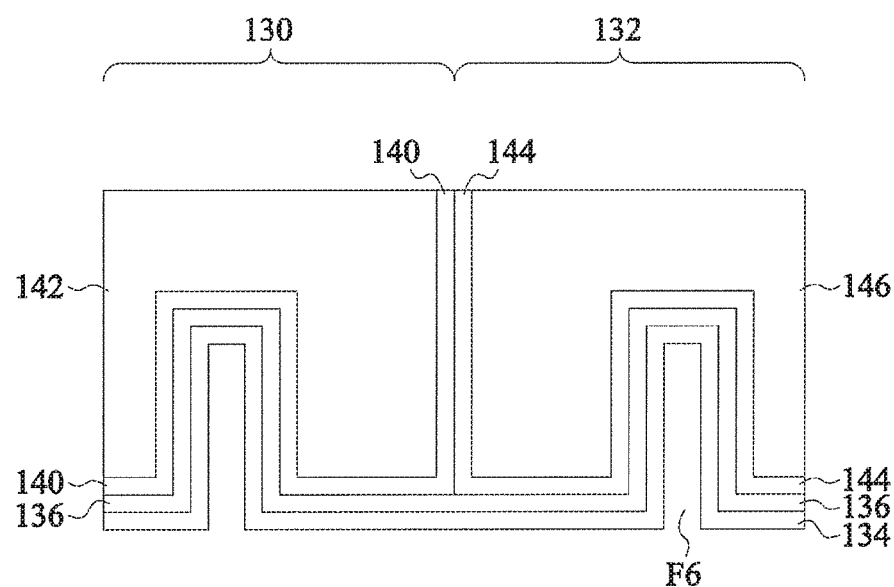

A second conductive material layer 144 is formed over the second work function adjustment layer 136 covering the second fin F6, as shown in FIG. 32. The second conductive material layer may include one or more layers of W, Ti, TiN, titanium-aluminum alloy, Al, AlN, Ta, TaN, TaC, TaCN, TaSi, NiSi, CoSi, and other conductive metals. The second conductive material layer 144 is formed of the same or different material than the first conductive material layer 140. The first and second conductive material layers can be the same material because conductive material thickness also influences threshold voltage. When the materials are the same, the threshold voltage of the different transistors are adjusted by varying the thicknesses of the conductive material layers. The second conductive material layer 144 may be formed to a thickness of about 1 nm to about 10 nm. The second conductive material layer 144 may be deposited by any suitable process, including CVD, PVD, ALD, and electroplating. A portion of the second conductive layer 144 is formed immediately adjacent the portion of the first conductive material layer 140 that was formed along an edge of the mask 138 covering the second fin.

The gate electrode in the second region 132 is formed as shown in FIG. 32 in some embodiments, after the second conductive material 144 is formed. A second metal gate fill material 146 is subsequently formed in the second region 132 covering the second conductive material layer 144 covering the second fin F6. The second metal gate fill material 146 may include one or more layers of W, Ti, TiN, titanium-aluminum alloy, Al, AlN, Ta, TaN, TaC, TaCN, TaSi, NiSi, CoSi, and other conductive metals. The second metal gate fill material 146 may be the same or different from the first metal gate fill material 142. In certain embodiments, the second metal gate fill material is tungsten. The second metal gate fill material 146 may be deposited by any suitable process, including CVD, PVD, ALD, and electroplating.

It is understood that additional operations can be provided before, during, and after processes shown by FIGS. 28-32, and some of the operations described above can be replaced or eliminated for additional embodiments of the method. The order of the operations/processes may be interchangeable. It is further understood that the device shown in FIG. 32 undergoes further CMOS processes to form various features such as interconnect metal layers, dielectric layers, passivation layers, etc.

In some embodiments of the disclosure, source/drain electrodes are formed contacting the respective source/drain regions. The electrodes may be formed of a suitable conductive material, such as copper, tungsten, nickel, titanium, or the like. In some embodiments, a metal silicide is formed at the conductive material and source/drain interface to improve conductivity at the interface. In one example, a damascene and/or dual damascene process is used to form copper-based multilayer interconnection structures. In some embodiments, metal plugs are formed contacting the source/drain regions. In certain embodiments, tungsten is used to form tungsten plugs Semiconductor devices according to embodiments of the present disclosure have increased reliability, reduced gate current leakage, and improved threshold voltage tuning. Semiconductor devices according to the present disclosure have reduced fin top damage because the high-k dielectric layer and work function adjustment layers suffer less damage and remain intact throughout the fabrication process, thereby reducing gate current leakage. In addition, the semiconductor devices avoid the difficulties of fabricating devices with high aspect ratio gate electrode layers by preventing the buildup of metal layers on the fins because redundant metal layers are removed from the fins.

One embodiment of the disclosure is a method for manufacturing a semiconductor device including forming a plurality of fins in a first and a second region defined on a semiconductor substrate. The plurality of fins includes a first fin disposed in a first portion of the first region, a second fin disposed in a second portion of the first region, a third fin disposed in a first portion of the second region, and a fourth fin disposed in a second portion of the second region. A dielectric layer is formed over the first to fourth fins and a work function adjustment layer is formed over the dielectric layer. A first hard mask having a first thickness is formed covering the third and fourth fins having the dielectric layer and the work function adjustment layer. A first conductive material layer is formed over the first fin in the first portion of the first region and not over the second fin in the second portion of the second region. A second conductive material layer is formed over the first and second fins. A first metal gate electrode fill material is formed over the first and second fins in the first region. The first hard mask covering the third and fourth fins is removed. A third conductive material layer is formed over the third fin in the first portion of the second region and not over the fourth fin in the second portion of the second region. A fourth conductive material layer is formed over the third and fourth fins in the second region, and a second metal gate electrode fill material is formed over the third and fourth fins in the second region.

Another embodiment of the disclosure is a method for manufacturing a semiconductor device, including forming a plurality of fins in a first and a second region defined on a semiconductor substrate. The plurality of fins includes a first group of fins arranged in the first region and a second group of fins arranged in the second region. A dielectric layer is formed over the first region and the second region. A first conductive material layer having a first thickness is formed over the first region and the second region. The first conductive material layer is removed over a portion of the first region. A second conductive material layer having a second thickness is formed over the first region and the second region. A first metal gate electrode fill material is formed over the first region and the second region. The first metal gate electrode fill material is removed over the second region. The first conductive material layer over the second region and the second conductive material layer over the second region are removed. A third conductive material layer is formed over the first region and the second region. The third conductive material layer over a portion of the second region is removed. A fourth conductive material layer is formed over the first region and the second region. A second metal gate electrode fill material is formed over the second region.

Another embodiment of the disclosure is a semiconductor device including a plurality of fins in a first and a second region defined on a semiconductor substrate. The plurality of fins includes a first group of fins arranged in the first region and a second group of fins arranged in the second region. A dielectric layer overlies the first region and the second region. A first conductive material layer overlies a first portion of the first region. A second conductive material layer overlies the first portion of the first region and a second portion of the first region. A third conductive material layer overlies a first portion of the second region. A fourth conductive material layer overlies the first portion of the second region and a second portion of the second region. A first metal gate fill material overlies the second conductive material layer, and a second metal gate fill material overlies the fourth conductive material layer. The first metal gate fill material and the second metal gate fill material are separated from each other by the third conductive material layer and the fourth conductive material layer and there is no conductive material layer between the first metal gate fill material and the second metal gate fill material that overlies both the first region and the second region.

Another embodiment of the disclosure is a method for manufacturing a semiconductor device including a first field effect transistor (FET) and a second FET. The method includes forming a first fin for the first FET and a second fin for the second FET over a substrate. A gate dielectric layer is formed over the first fin and the second fin. A first work function adjustment layer is formed over the gate dielectric layer over the first and second fins. The second fin with the first work function adjustment layer is covered with a mask layer. A first conductive material layer is formed over the first work function adjustment layer over the first fin. The first fin having the first conductive material layer is covered with a first gate fill metal. The mask layer is removed, and a second conductive material layer is formed over the first work function adjustment layer over the second fin.

Another embodiment of the disclosure is a semiconductor device including a first field effect transistor (FET) including a first fin and a second FET including a second fin formed on a semiconductor substrate. A gate dielectric layer covers the first and second fins, and a first work function layer covers the gate dielectric layer covering the first and second fins. A first conductive material layer covers the first work function adjustment layer covering the first fin. A second conductive material layer covers the first work function adjustment layer covering the second fin. A first metal gate fill material covers the first conductive material layer covering the first fin, and a second metal gate fill material covers the second conductive material layer covering the second fin. The first metal gate fill material and the second metal gate fill material are separated from each other by the first conductive material layer and the second conductive layer, and there is no other conductive material layer between the first conductive layer and the second conductive material layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a plurality of fins in a first and a second region defined on a semiconductor substrate,
    wherein the plurality of fins includes a first fin disposed in a first portion of the first region, a second fin disposed in a second portion of the first region, a third fin disposed in a first portion of the second region, and a fourth fin disposed in a second portion of the second region;
    forming a dielectric layer over the first to fourth fins and forming a work function adjustment layer over the dielectric layer;
    forming a first hard mask having a first thickness covering the third and fourth fins having the dielectric layer and the work function adjustment layer;
    forming a first conductive material layer over the first fin in the first portion of the first region and not over the second fin in the second portion of the first region;
    forming a second conductive material layer over the first and second fins;
    forming a first metal gate electrode fill material over the first and second fins in the first region;
    removing the first hard mask covering the third and fourth fins;
    forming a third conductive material layer over the third fin in the first portion of the second region and not over the fourth fin in the second portion of the second region;
    forming a fourth conductive material layer over the third and fourth fins in the second region; and
    forming a second metal gate electrode fill material over third and fourth fins in the second region.

2. The method according to claim 1, further comprising forming a second hard mask having a second thickness covering the third and fourth fins prior to forming the first hard mask.

3. The method according to claim 2, wherein the first thickness is greater than the second thickness.

4. The method according to claim 2, wherein the removing the first hard mask covering the third and fourth fins includes removing the second hard mask covering the third and fourth fins.

5. The method according to claim 1, wherein the dielectric layer comprises a high-k dielectric material.

6. The method according to claim 5, further comprising a forming a work function adjustment material over the high-k dielectric material.

7. The method according to claim 6, wherein the work function adjustment material comprises a first work function adjustment material layer and a second work function adjustment material layer, wherein the first work function adjustment material layer and the second work function adjustment material layer comprise different materials.

8. The method according to claim 1, wherein the forming the first hard mask includes forming the first hard mask covering the first and second fins, and a portion of the first hard mask covering the first and second fins is removed prior to forming the first conductive material layer.

9. The method according to claim 1, wherein the forming the third conductive layer includes forming the third conductive material layer overlying the first region, and the forming the fourth conductive layer includes forming fourth conductive material layer overlying the first region.

10. A method for manufacturing a semiconductor device, comprising:
    forming a plurality of fins in a first and a second region defined on a semiconductor substrate,
    wherein the plurality of fins includes a first group of fins arranged in the first region and second group of fins arranged in the second region;
    forming a dielectric layer over the first region and the second region;
    forming a first conductive material layer having a first thickness over the first region and the second region;
    removing the first conductive material layer over a portion of the first region;
    forming a second conductive material layer having a second thickness over the first region and the second region;
    forming a first metal gate electrode fill material over the first region and the second region;
    removing the first metal gate electrode fill material over the second region;
    removing the first conductive material layer over the second region and the second conductive material layer over the second region;

forming a third conductive material layer over the first region and the second region;
removing the third conductive material layer over a portion of the second region;
forming a fourth conductive material layer over the first region and the second region; and
forming a second metal gate electrode fill material over the second region.

11. The method according to claim 10, further comprising removing the third conductive material layer overlying the first region and removing the fourth conductive material layer overlying the first region.

12. The method according to claim 10, wherein the dielectric layer comprises a high-k dielectric material.

13. The method according to claim 12, further comprising a forming a work function adjustment material over the high-k dielectric material.

14. The method according to claim 13, wherein the work function adjustment material comprises a first work function adjustment material layer and a second work function adjustment material layer, wherein the first work function adjustment material layer and the second work function adjustment material layer comprise different materials.

15. The method according to claim 10, further comprising planarizing the first and second regions after forming the second metal gate electrode fill material over the second region.

16. A semiconductor device comprising a plurality of fins in a first and a second region defined on a semiconductor substrate,
wherein the plurality of fins includes a first group of fins arranged in the first region and a second group of fins arranged in the second region;
a dielectric layer overlying the first region and the second region;
a first conductive material layer overlying a first portion of the first region;
a second conductive material layer overlying the first portion of the first region and a second portion of the first region;
a third conductive material layer overlying a first portion of the second region;
a fourth conductive material layer overlying the first portion of the second region and a second portion of the second region;
a first metal gate fill material overlying the second conductive material layer; and
a second metal gate fill material overlying the fourth conductive material layer,
wherein the first metal gate fill material and the second metal gate fill material are separated from each other by the third conductive material layer and the fourth conductive material layer and there is no conductive material layer between the first metal gate fill material and the second metal gate fill material that overlies both the first region and the second region.

17. The semiconductor device of claim 16, wherein the dielectric layer comprises a high-k dielectric material.

18. The semiconductor device of claim 17, further comprising a work function adjustment material overlying the high-k dielectric material.

19. The semiconductor device of claim 18, wherein the work function adjustment material comprises a first work function adjustment material layer and a second work function adjustment material layer, wherein the first work function adjustment material layer and the second work function adjustment material layer comprise different materials.

20. The semiconductor device of claim 16, wherein:
the first region comprises P-type field effect transistors and the second region comprises N-type field effect transistors,
the first portion of the first region comprises a ultra-low voltage threshold transistor,
the second portion of the first region comprises a standard voltage threshold transistor,
the first portion of the second region comprises a standard voltage threshold transistor, and
the second portion of the second region comprises a ultra-low voltage threshold transistor.

21. A method for manufacturing a semiconductor device including a first field effect transistor (FET) and a second FET, the method comprising:
forming a first fin for the first FET and a second fin for the second FET over a substrate;
forming a gate dielectric layer over the first fin and the second fin;
forming a work function adjustment layer comprising a first work function adjustment layer and a second work function adjustment layer over the gate dielectric layer over the first and second fins;
covering the work function adjustment layer covering the second fin with a mask;
forming a first conductive material layer over the work function adjustment layer over the first fin;
covering the first fin having the first conductive material layer with a first gate fill metal;
simultaneously removing the mask covering the second fin and maintaining the second work function adjustment layer over the second fin; and
after the removing the mask, forming a second conductive material layer over the second work function adjustment layer over the second fin.

22. The method according to claim 21, wherein covering the second fin with a mask layer comprises:
forming a mask over the first fin and the second fin; and
removing a portion of the mask covering the first fin.

23. The method according to claim 21, wherein the forming the first conductive material adjustment layer over the work function adjustment layer over the first fin includes forming a portion of the first conductive material layer along an edge of the mask covering the second fin.

24. The method according to claim 23, wherein the forming the second conductive layer over the work function adjustment layer over the second fin includes forming a portion of the second conductive material layer immediately adjacent the portion of the first conductive material layer that was formed along an edge of the mask covering the second fin.

25. The method according to claim 21, further comprising covering the second fin having the second conductive material layer with a second gate fill metal.

26. A semiconductor device comprising:
a first field effect transistor (FET) including a first fin and a second FET including a second fin formed on a semiconductor substrate;
a gate dielectric layer covering the first and second fins;
a work function adjustment layer covering the gate dielectric layer covering the first and second fins;
a first conductive material layer covering the work function adjustment layer covering the first fin;
a second conductive material layer covering the work function adjustment layer covering the second fin;
a first metal gate fill material covering the first conductive material layer covering the first fin; and a second metal gate fill material covering the second conductive material layer covering the second fin, wherein the first metal gate fill material and the second metal gate fill material are separated from each other by the first conductive material layer and the second conductive material layer and there is no other conductive material layer between the first conductive material layer and the second conductive material layer, and a portion of the second conductive layer is formed immediately adjacent a portion of the first conductive layer.

27. The semiconductor device of claim 26, wherein the first FET is a first conductivity type transistor and the second FET is a second conductivity type transistor.

28. The semiconductor device of claim 26, wherein the first conductive material layer is formed of a different material than the second conductive material layer.

29. The semiconductor device of claim 26, wherein the first gate fill material is formed of a different material than the second gate fill material.

\* \* \* \* \*